US006815323B1

(12) United States Patent
Lu et al.

(10) Patent No.: US 6,815,323 B1
(45) Date of Patent: Nov. 9, 2004

(54) OHMIC CONTACTS ON N-TYPE SILICON CARBIDE USING CARBON FILMS

(75) Inventors: Weijie Lu, Nashville, TN (US); William C. Mitchel, Beavercreek, OH (US); Warren E. Collins, Madison, TN (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 10/340,815

(22) Filed: Jan. 10, 2003

(51) Int. Cl.[7] .................... H01L 21/28; H01L 21/3205
(52) U.S. Cl. ................... 438/602; 257/77; 438/597; 438/621; 438/767; 438/931
(58) Field of Search .................. 257/77, 78, 81, 257/96, 97, 103, 750; 438/571–573, 584, 597, 602, 621, 767, 931

(56) References Cited

U.S. PATENT DOCUMENTS

| | | | |
|---|---|---|---|
| 4,990,994 A | 2/1991 | Furukawa et al. | |
| 5,124,779 A | 6/1992 | Furukawa et al. | |
| 5,323,022 A | 6/1994 | Glass et al. | |
| 5,389,799 A | 2/1995 | Uemoto | |
| 5,409,859 A | 4/1995 | Glass et al. | |
| 5,442,200 A | 8/1995 | Tischler | |
| 5,652,437 A | 7/1997 | Harris | |
| 5,856,013 A * | 1/1999 | Abkowitz et al. | 428/412 |
| 5,895,260 A | 4/1999 | Bhatnagar et al. | |
| 6,043,513 A | 3/2000 | Kronlund | |
| 6,139,624 A | 10/2000 | Rupp | |
| 6,147,407 A * | 11/2000 | Jin et al. | 257/758 |
| 6,180,958 B1 | 1/2001 | Cooper, Jr. | |
| 6,203,864 B1 | 3/2001 | Zhang et al. | |
| 6,365,494 B2 | 4/2002 | Rupp et al. | |
| 6,410,460 B1 | 6/2002 | Shalish et al. | |
| 6,468,890 B2 * | 10/2002 | Bartsch et al. | 438/597 |
| 2003/0080426 A1 * | 5/2003 | Klauk et al. | 257/744 |
| 2003/0146437 A1 * | 8/2003 | Friedrichs et al. | 257/77 |

* cited by examiner

*Primary Examiner*—Kamand Cuneo
*Assistant Examiner*—Asok Kumar Sarkar
(74) *Attorney, Agent, or Firm*—Gerald B. Hollins; Thomas L. Kundert

(57) ABSTRACT

Ohmic contact formation inclusive of Carbon films on 4H and 6H n-type Silicon Carbide is disclosed. Contact formation includes an initial RF sputtering to produce an amorphous Carbon film with the $sp^2/sp^3$ Carbon ratio of about 1.0 measured by X-ray photoelectron spectroscopy. This Carbon film gradually evolves from $sp^3$ to $sp^2$ structures of high $sp^2$ content during an annealing at temperatures ranging from 600° C. to 1350° C. depending on the substrate doping levels, between $10^{16}$ and $10^{19}$, employed. Formation of $sp^2$ Carbon is accelerated by the presence of metal and gaseous catalytic agents including for example nickel and argon. The $sp^2$ Carbon structures consist especially of nano-size graphitic flakes and also of amorphous aromatic-like Carbon structures, and polyene-like Carbon structures, as are revealed by Raman spectroscopy. Ohmic contact is achieved when a sufficient amount of nano-graphitic flakes are formed at the selected annealing temperature.

20 Claims, 20 Drawing Sheets

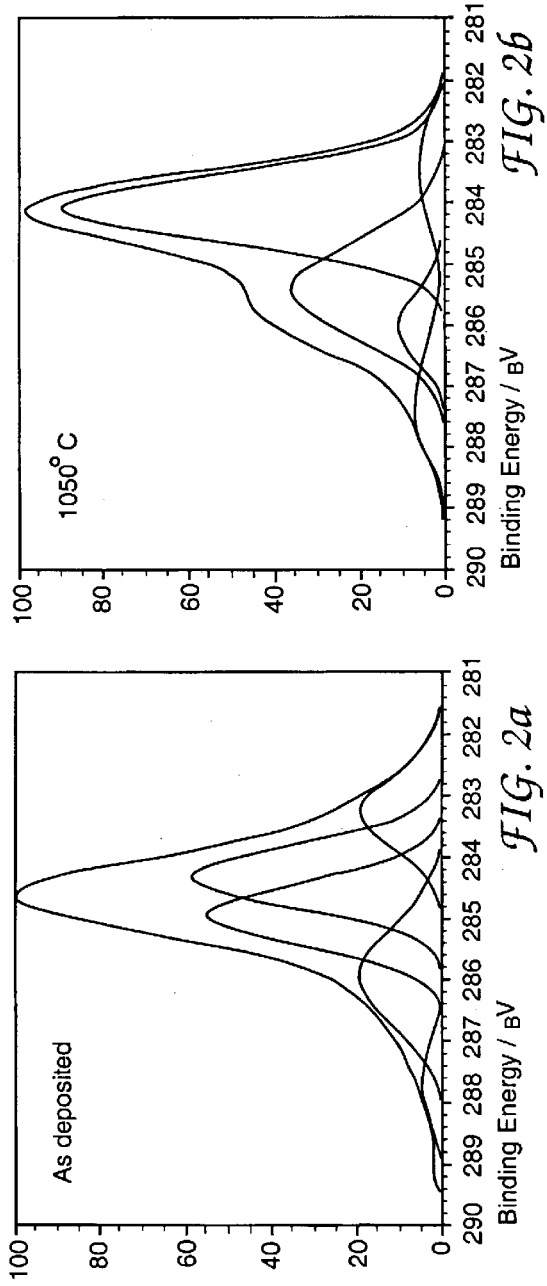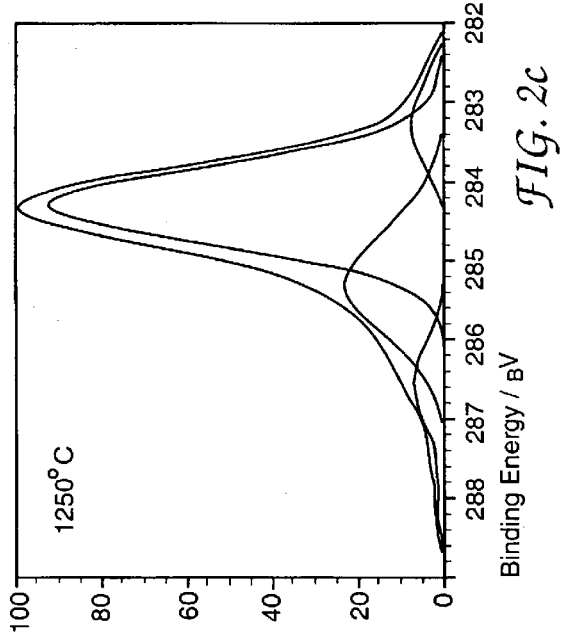

Ni/C/SiC

Co/C/SiC

NiCr/C/SiC

Cr/C/Sir

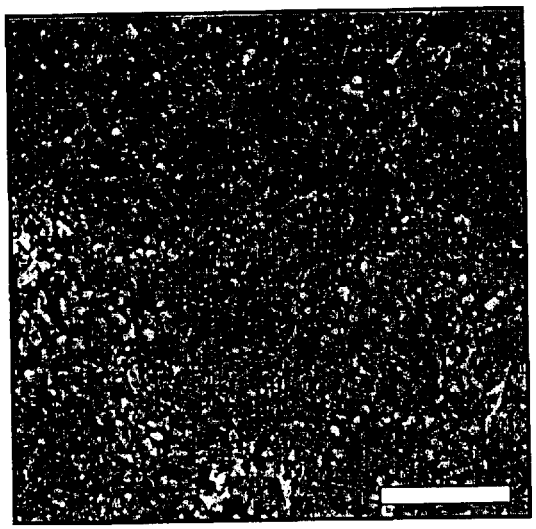 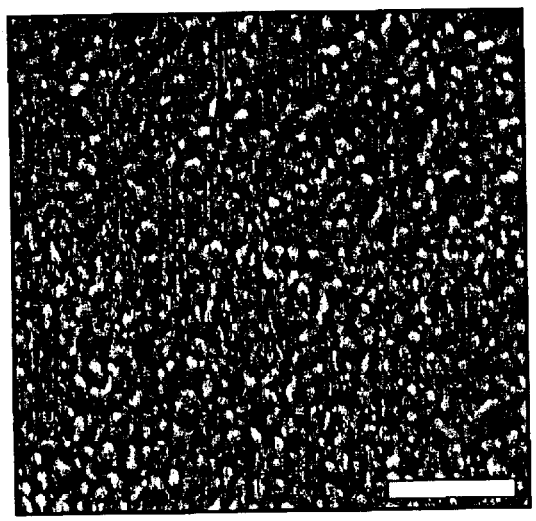
Al/C/SiC — FIG. 13a
Ti/C/SiC — FIG. 13b

Au/C/SiC

Mo/C/SiC

W/C/SiC

OHMIC CONTACTS ON N-TYPE SILICON CARBIDE USING CARBON FILMS

CROSS REFERENCE TO RELATED PATENT DOCUMENTS

The present document is somewhat related to the copending and commonly assigned patent document "OHMIC CONTACTS ON p-TYPE SILICON CARBIDE USING CARBON FILMS", Ser. No. 10/340,766 filed of even date herewith. The contents of this related even filing date document are hereby incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

Silicon Carbide semiconductor material is known to have properties that are of significant advantage over the Germanium, Silicon and Gallium Arsenide materials of present majority use in electronic devices. The large bandgap, the breakdown electrical field characteristics, the upper limit of electron velocity, the high possible operating temperature and the greater thermal conductivity of Silicon Carbide with respect to currently used materials are each areas of significant advantage obtained with use of Silicon Carbide in semiconductor devices.

Ohmic contact formation on Silicon Carbide (SiC) semiconductor material is however a significant concern in the successful fabrication of Silicon Carbide electronic devices. High frequency and high power Silicon Carbide semiconductor devices are especially known to require the use of quality ohmic contacts and are presently limited in performance by the lack of a satisfactory contact arrangement. For example, undesirably large ohmic contact resistance limits the high frequency performance of the Silicon Carbide devices-primarily by introducing undesired contact resistance and reduced current flow in connections to a Silicon Carbide device. It has been determined that contact resistivity must be reduced to about $10^{-6}$ $\Omega cm^2$ in order to achieve high frequency Silicon Carbide semiconductor devices usable in 8 to 12 gigahertz X-band radar systems [1,2]. Parenthetic numbers such as these identify references listed in APPENDIX 1 at the close of this specification. Generally, good ohmic contact formation can be presently achieved only with use of extremely highly doped Silicon Carbide semiconductor layers, layers having doping levels in the $10^{18}$ or $10^{19}$ atoms per cubic centimeter range, and with thermal annealing at around 1000° Celsius. Such high temperature annealing however introduces difficulties in device fabrications [3–5]. Although many studies have been published, the mechanism of ohmic contact formation on Silicon Carbide yet remains somewhat unclear.

With respect to the elements used in doping Silicon Carbide semiconductor and without wishing to be bound or limited by questions regarding this somewhat wafer manufacturer-proprietary topic, applicants understand the element nitrogen to be an important dopant used in achieving n-type Silicon Carbide. For present purposes therefore it appears sufficient to state that n-type Silicon Carbide is available in epitaxial wafer form from suppliers to the semiconductor field and that at least one supplier of such material is identified in the paragraphs following herein.

SUMMARY OF THE INVENTION

The present invention provides for low electrical resistance ohmic contact with n-type Silicon Carbide semiconductor material.

It is therefore an object of the present invention to provide low electrical resistance n-type Silicon Carbide ohmic contacts that can be achieved at a lower processing temperature than currently used contact arrangements.

It is another object of the invention to provide a usable n-type Silicon Carbide ohmic contact that is achievable with contact related temperatures below 900 degrees Celsius.

It is another object of the invention to provide a usable n-type Silicon Carbide ohmic contact that is achievable with annealing temperatures as low as 700 degrees Centigrade.

It is another object of the invention to provide a n-type Silicon Carbide ohmic contact enabling use of lower Silicon Carbide semiconductor material doping levels than other contact arrangements.

It is another object of the invention to provide a n-type Silicon Carbide ohmic contact in which graphitic $sp^2$ Carbon materials are used to an advantage rather than imposing the usually accepted detrimental effects.

It is another object of the invention to provide a n-type Silicon Carbide ohmic contact employing a specific form of Carbon in its fabrication process.

It is another object of the invention to provide an improved n-type Silicon Carbide ohmic contact that is achieved through use of a metallic catalytic agent during contact fabrication.

It is another object of the invention to provide an improved n-type Silicon Carbide ohmic contact that is achieved through use of a nickel catalytic agent or another metal catalytic agent during contact fabrication.

It is another object of the invention to provide an improved n-type Silicon Carbide ohmic contact achievable with annealing temperatures some three hundred degrees Celsius below those used in present Silicon Carbide device ohmic contact fabrications.

It is another object of the invention to provide an improved n-type Silicon Carbide ohmic contact achievable with semiconductor doping concentrations some two orders of magnitude below those used in present Silicon Carbide device ohmic contact fabrications.

It is another object of the invention to provide an improved n-type Silicon Carbide ohmic contact through the use of nano-sized graphitic structures in the contact region.

It is another object of the invention to provide an improved n-type Silicon Carbide ohmic contact achievable through the predictable decomposition of an initial form of Carbon into a contact-usable different form of Carbon.

It is another object of the invention to provide an improved n-type Silicon Carbide ohmic contact achievable through use of either 4H or 6H Silicon Carbide starting materials.

These and other objects of the invention will become apparent as the description of the representative embodiments proceeds.

These and other objects of the invention are achieved by the method of fabricating a graphitic $sp^2$ Carbon-inclusive ohmic contact for a n-type Silicon Carbide semiconductor device, said method comprising the steps of:

providing a clean surfaced wafer sample of n-type Silicon Carbide of selected doping concentration between $1 \times 10^{16}$ and $1 \times 10^{20}$ atoms per cubic centimeter;

covering said sample clean surface with a layer of amorphous $sp^2$ and $sp^3$ Carbon mixture;

supplying a layer of Carbon conversion-accelerating catalytic metal over said sample layer of amorphous $sp^2$ and $sp^3$ Carbon mixture;

converting a substantial portion of said catalytic metal covered amorphous sp² and sp³ Carbon mixture on said sample to metal catalyzed nano-sized graphitic flakes of sp² Carbon;

said converting step including a heat treating annealing of said sample at a temperature of at least 700 degrees Celsius, a temperature selected in response to said selected doping concentration between $1\times10^{16}$ and $1\times10^{20}$ atoms per cubic centimeter;

disposing an external circuit electrically conductive element in contact with a selected portion of said converted, metal catalyzed nano-sized graphitic flakes of sp² Carbon.

BRIEF DESCRIPTION OF THE DRAWINGS

The accompanying drawings incorporated in and forming a part of the specification, illustrates several aspects of the present invention and together with the description serve to explain the principles of the invention. In the drawings:

FIG. 2a shows deconvoluted X-ray photoelectron spectra for Examples 1–4 samples with amorphous, as deposited, Carbon.

FIG. 2b shows deconvoluted X-ray photoelectron spectra for Examples 1–4 samples after annealing at a first temperature.

FIG. 2c shows deconvoluted X-ray photoelectron spectra for Examples 1–4 samples after annealing at a second temperature.

FIG. 13a shows a scanning electron microscope image of an annealed surface of another metal/Carbon/n-type Silicon Carbide combination.

FIG. 13b shows a scanning electron microscope image of an annealed surface of another metal/Carbon/n-type Silicon Carbide combination.

DETAILED DESCRIPTION OF THE INVENTION

The present invention is believed fully disclosed by way of the series of Example Ohmic contact formations following.

EXAMPLE 1 THROUGH EXAMPLE 4

Metal Free Graphitized Carbon Contacts on n-type Silicon Carbide

The following described four Examples employ the same materials and structures in the formation of ohmic and non-ohmic contacts with n-type Silicon Carbide semiconductor material. The four Examples differ as to the annealing temperatures employed and thereby attain differing degrees of success in achieving ohmic contact with Silicon Carbide. Notably in these Examples 1–4 no catalytic metal is used in accomplishing the achieved contacts and therefore the employed annealing temperatures are higher than those present in the later metal-inclusive examples appearing herein.

Silicon Carbide wafers of the 4H type and several different doping concentrations are used in the following four examples. Additionally a wafer of the 6H type is also used. One of the wafers is of the 4H-Silicon Carbide n-type with doping concentrations of $2.0 \times 10^{18}$ atoms of Nitrogen per $cm^3$ and with 8° off-axis orientation; such wafers are available from Cree Incorporated, of Durham, N.C., USA. The sample substrate surface may be cleaned by a modified RCA method [8] generally including the steps of:

a. Immersion in $NH_4OH:H_2O_2:H_2O$ (1:1:2) at 85° C. for 5 minutes;
b. Immersion in $HCl:H_2O_2:H_2O$ (1:1:2) at 85° C. for 5 minutes;
c. Immersion in $HF:H_2O$ (20% solution) for 5 minutes;
d. Immersion in $HNO_3$ (50%) at 90° C. for 5 minutes;
e. Immersion in $HF:H_2O$ (10% solution) for 2 minutes;
f. Immersion in $CH_3OH$ before metal thin film deposition.

Rinse with de-ionized water between each of these steps.

An amorphous Carbon film over the Silicon Carbide substrate surface may be formed by a RF sputtering system using a pyrolytic graphite target of the type available from Kurt J. Lesker Company of Clairton, Pa., 15025. The Carbon dots formed on the Silicon Carbide are about 50 nm thick and 0.75 mm in diameter. The resulting amorphous Carbon is comprised of a mixture of $sp^2$ and $sp^3$ Carbon structures.

Figure 1:
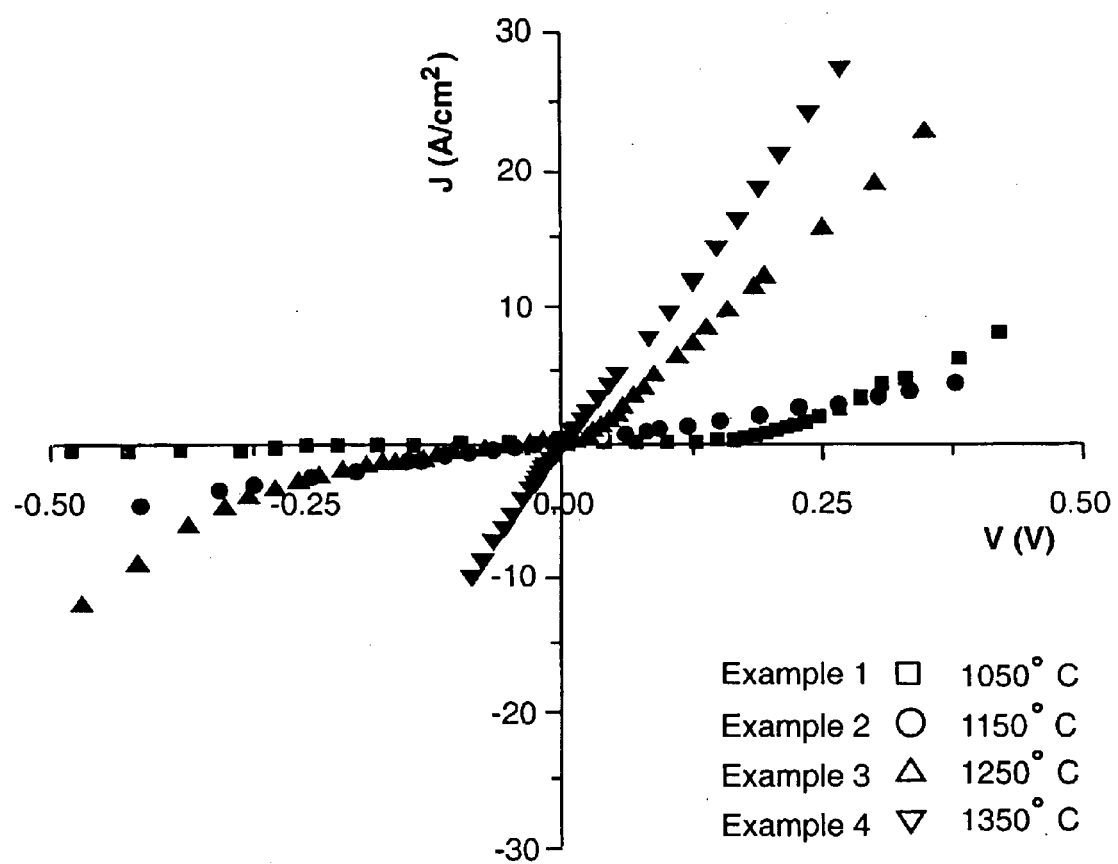
FIG. 1 shows current and voltage relationships for metal free contact samples according to Examples 1–4 herein when annealing at several different temperatures is used.
Figure 6:
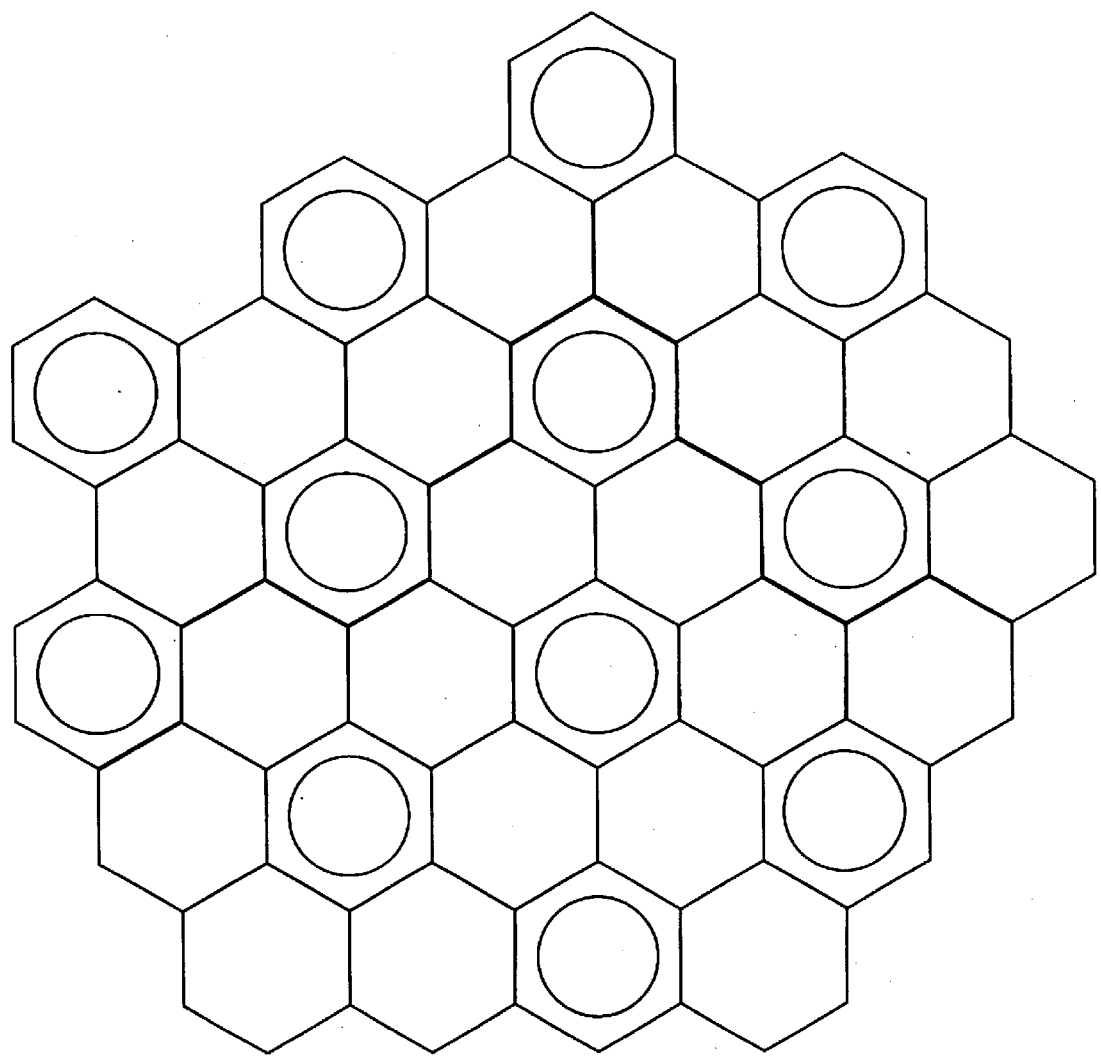
FIG. 6 shows the structure of nano-graphitic flake Carbon.

The Carbon film as deposited in this manner exhibits high electrical resistivity. The samples are however annealed in high purity Argon (with Oxygen content<1 ppm) at selected temperatures for 30 minutes in order to decrease this resistance and form an ohmic contact. FIG. 1 in the drawings shows the I-V or current-voltage curves following such annealing for the series of Carbon/4H-Silicon Carbide samples comprising Examples 1–4. As shown by the I-V curves in FIG. 1 for Examples 1–3 a majority of the contacts formed in this manner and with this doping concentration exhibit Schottky contact behavior when annealing is performed at temperatures in the range from 1050–1250° Celsius (C.). After annealing at 1350° C. however, an ohmic contact is formed in the case of the Example 4 sample. Such thermal annealing increases the degree of graphitization of the initially amorphous Carbon i.e., increases the conversion of amorphous Carbon to nano-graphitic flakes [7]. The results in FIG. 1 thus indicate graphitized Carbon can form ohmic contacts on SiC. FIG. 6 in the drawings shows the crystal structure of the desired nano-graphitic flakes. One flake of this material has a diameter of three to four nanometers and has one atomic layer of thickness.

Figure 4A:
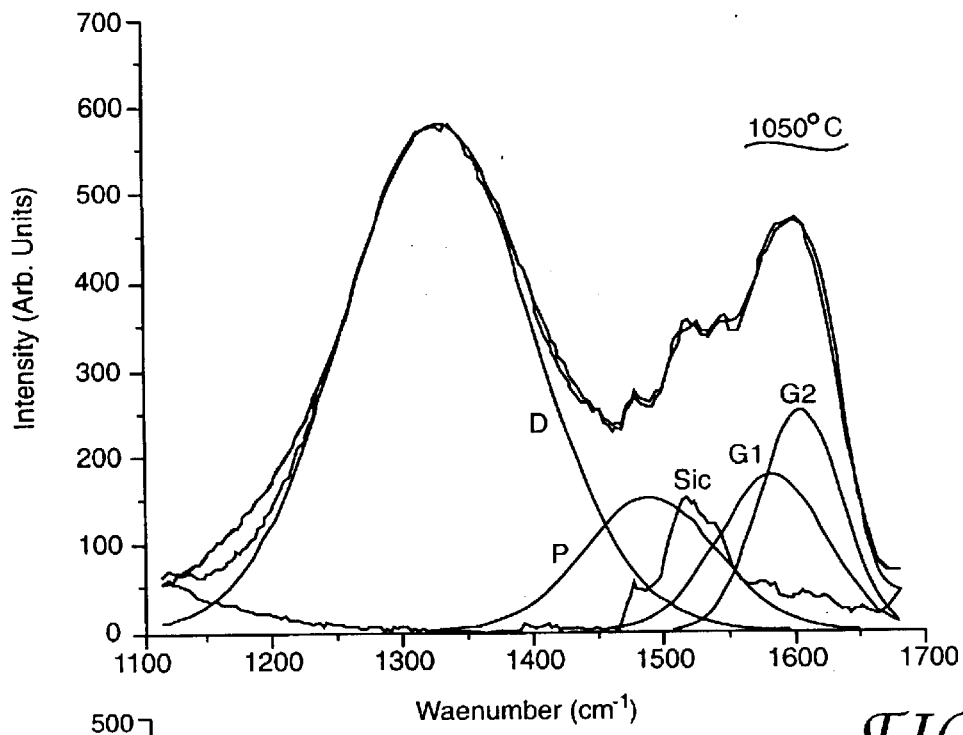
FIG. 4a shows a deconvoluted Raman spectrum for Examples 1–4 samples of n-type Carbon/Silicon Carbide after annealing at 1050° C.
Figure 17:
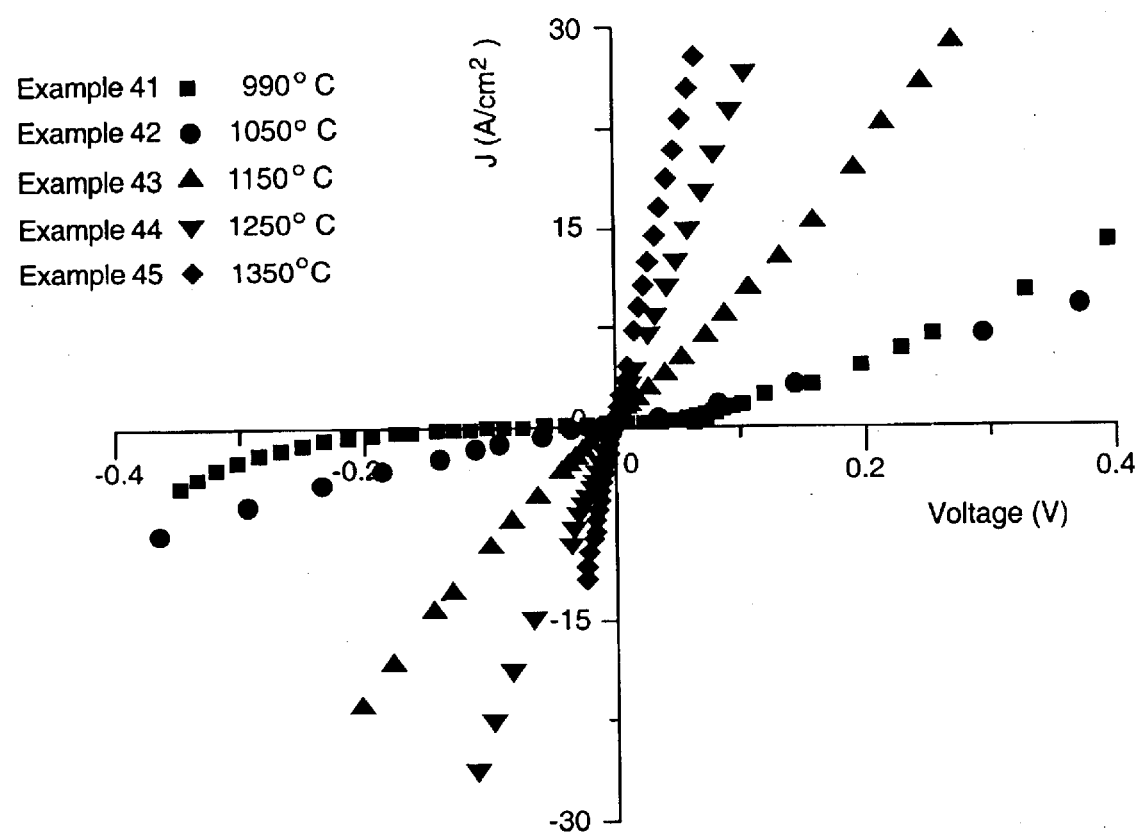
FIG. 17 shows current and voltage relationships of the FIG. 1 type for four additional metal-free contact samples involving annealing at four different temperatures.

Additional data relating to that of examples 1–4 is included herein in the FIG. 17 drawing and in the Table 4 of APPENDIX 2. FIG. 17 shows current and voltage relationships of the FIG. 1 type for five additional metal-free contact examples, examples 41 through 45, involving annealing at five different temperatures. FIG. 17 shows the I-V (current-voltage) curves for Carbon/4H—SiC samples after being annealed at the indicated temperatures between 990 and 1350° C. in Ar for 30 minutes. The FIG. 17 4H—SiC substrate is n-type, Si-face, on-axis, and with doping concentration of $1.3 \times 10^{19}$ $cm^{-3}$. The Carbon dots (50 nm thick and 0.75 mm in diameter) are deposited on the SiC substrates by RF sputtering using a pyrolytic graphite target (L.K. Lester Co.). The Carbon film as deposited exhibits a high electrical resistance. At annealing temperatures above 1050° C. however, the FIG. 17 I-V curves exhibit typical straight line ohmic contact behavior. The resistance on the Carbon/SiC interface decreases with increasing annealing temperatures in FIG. 17. In the FIG. 17 examples thermal annealing increases the degree of Carbon graphitization [7,44] and the results indicate the graphitized Carbon can form ohmic contacts on SiC. The greater number of Ohmic contacts achieved in the FIG. 17 examples in comparison with the FIG. 1 examples are attributed to the greater doping level present in the FIG. 17 Silicon Carbide material. Clearly the combination of the FIG. 1 and the FIG. 17 results support the formation of graphitic Carbon based Ohmic contacts with Silicon Carbide even in the absence of catalytic metal.

Figure 4B:
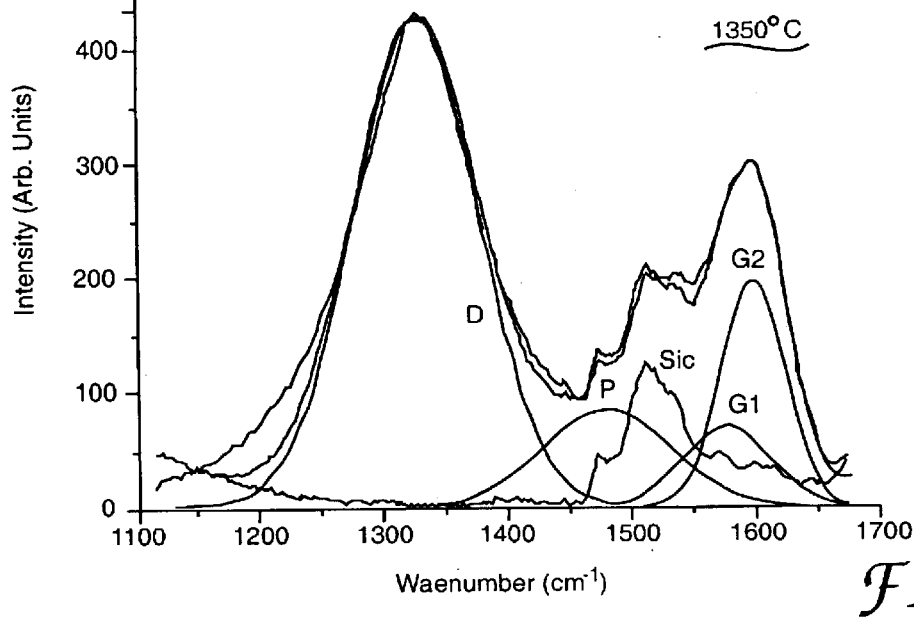
FIG. 4b shows a deconvoluted Raman spectrum for Examples 1–4 samples of n-type Carbon/Silicon Carbide after annealing at 1350° C.

The data shown in Table 4 of the present document further supports the formation of Carbon based Ohmic contacts with Silicon Carbide even in the absence of catalytic metal. This FIG. 4 data viewed in a different perspective provides the specific resistivity data that is absent from the example 1 through 4 data discussed above; in the instance of the Table 4 data however a greater doping concentration is present in the Silicon Carbide. In the Table 4 examples 46 through 49 the 4H—SiC (Cree, Inc.) is n-type, Si-face, on-axis, and with doping concentration of $3.1 \times 10^{19}$ $cm^{-3}$. The SiC wafer is cut to $8 \times 8$ $mm^2$, cleaned by the RCA method, oxidized at 1150° C. in wet oxygen to form a sacrificial oxide film, and etched in HF solution.

The Table 4 TLM (transfer length method) structures may be photolithographically prepared. The size of the rectangular pads can be $50 \times 100$ $\mu m$, and the space between pads 25, 50, 75, 100, 125, and 150 $\mu m$, respectively. The Carbon film deposition may be performed using a DC sputtering system (DSC-300A sputter, Denton Vacuum, Inc.). A pyrolytic graphite target (K. J. Lester Co.) can be used for Carbon film deposition. 500 V may be applied for the Carbon deposition, and a 50 nanometer thickness achieved.

The Table 4 samples may be placed in a graphite furnace (Oxy-Gon Industries, Inc., Epsom, N.H.), and annealed in high purity Ar ($O_2$<1 ppm) atmosphere at the indicated temperatures for 30 minutes. The current-voltage characterization can be performed at room temperature using a MicroManipulator probe station (Model 1800KGS). A Keithley model 220 programmable current source can be used as the current source, and the drop voltage measured by a Keithley model 195 multimeter. FIG. 2a in the drawings shows the C1s core-level X-ray photoelectron spectra, XPS, of the FIG. 1 Carbon/Silicon Carbide samples as-deposited and FIG. 2b shows the spectra after thermal annealing at the Example 1 temperature of 1050° C. The FIG. 2b C1s XPS spectra can be deconvoluted into five peaks using the Gaussian-Lorentzian method. The five peaks are assigned to the following groupings:

the binding energy of the C1s peak is 283.2 electron volts, eV, for SiC,
284.3–284.5 eV for graphite-like Carbon ($sp^2$),
285.1 eV for diamond-like Carbon ($sp^3$),
286–287 eV for a C—O bond, and
288–289 eV for a C=O bond [9,10].

Deconvolution of the X-ray photoelectron spectra may be accomplished with the Vision 2 software available from Kratos Analytical of Japan, England and the U.S.; http://Kratos.com.

Small oxygen contaminations exist in the FIG. 2b samples mainly as C—O and C=O, since the annealed samples were exposed to air before the XPS analysis. As shown in FIG. 2a, RF sputtering produces an amorphous Carbon film, in which the $sp^2/sp^3$ ratio (i.e., the ratio of the FIG. 2a two mid-level peaks) is about 1. With increasing annealing temperatures, the graphite-like Carbon peak at 284.3 eV increases and the diamond-like peak at 285.1 eV decreases. The $sp^2/sp^3$ Carbon ratio on SiC increases to 2.5 after the Example 1 annealing at 1050° C., and to 4.6 at the Example 2 temperature of 1250° C. as may be observed in FIG. 2b and FIG. 2c. Therefore, it may be concluded that the deposited amorphous SP³ Carbon film evolves into more graphite-like SP² structure with increasing annealing temperatures.

Figure 3:
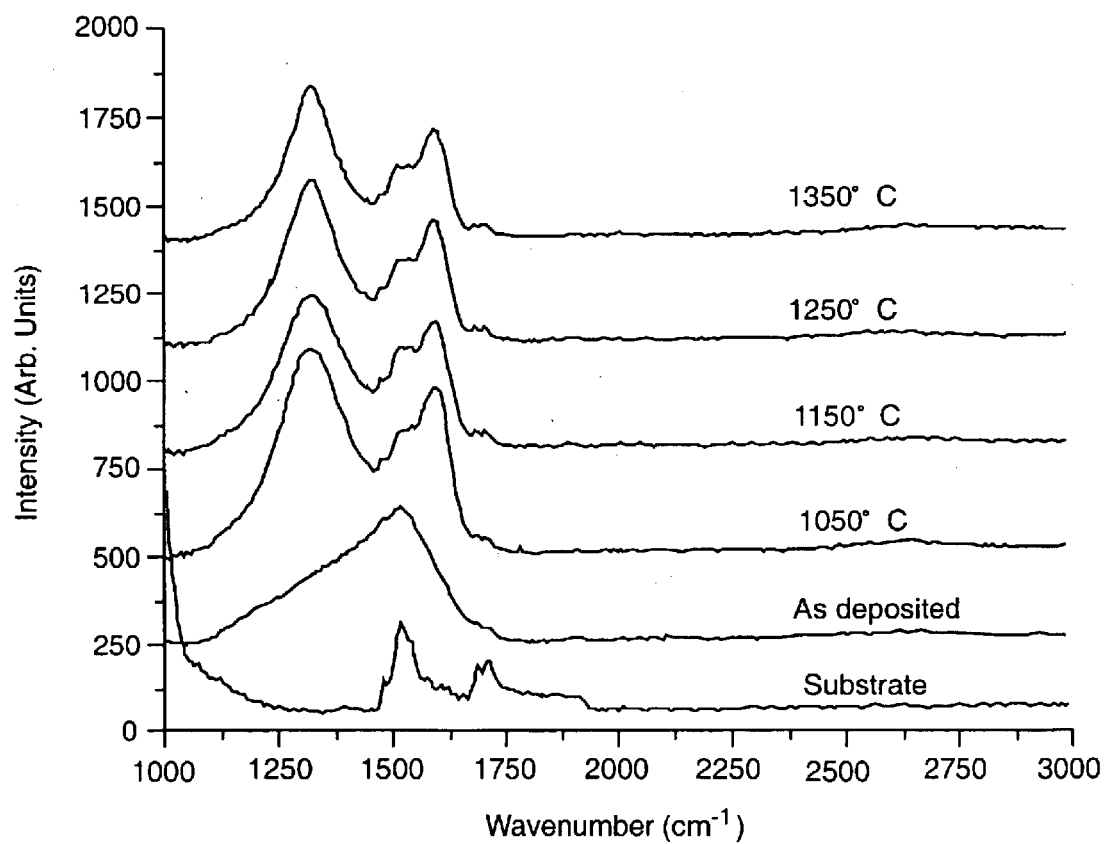
FIG. 3 shows the Raman spectra of example 1 samples after thermal annealing at different temperatures.

Raman spectroscopy is an effective technique for the characterization of crystalline, nano-crystalline, and amorphous Carbon structures [11,12]. The graphitization process converts Carbon from the sp³ to the sp² state, rearranges disordered Carbon structures into graphitic layer-like structures, aligns smaller graphitic flakes together to form larger planes, and forms stacking structures with neighboring layers. FIG. 3 in the drawings shows the Raman spectra of the Carbon/Silicon Carbide samples of Example 1–4 after thermal annealing at the respective Example temperatures. The Raman spectra in FIG. 3 are obtained with a LabRam Infinity MicroRaman Spectrometer (from the United Kingdom Jobin Yvon Horiba Group) using a 632.81 nm Helium-Neon laser excitation line. A 100× optical microscope may be used to focus on the measuring area. As shown, the Carbon film as deposited on the Silicon Carbide is typical amorphous Carbon with a broad peak at 1510 cm⁻¹, actually a peak dispersed over a wide range from 1100–1700 cm⁻¹. The Carbon films achieved by sputtering or evaporation at room temperature are a mixture of amorphous sp² and sp³ Carbon structures [13,14]. As shown by the lower curve in FIG. 3 the 4H—SiC substrate has several second order Raman bands in the region from 1465–1740 cm⁻¹ [15]. There are two main broad bands at about 1328 cm⁻¹ and 1593 cm⁻¹ from the Carbon film on the Silicon Carbide after annealing.

Reference publications 12, 15 and 68 in APPENDIX 1 of the present document include discussion of the topic of assigning certain capital letter-represented band identifications to selected parts of the Raman spectra of materials such as graphite. The following discussions of Raman spectra with respect to the present invention may thus be better appreciated with reference to these publications.

The FIG. 3 Raman band at 1350–1360 cm⁻¹ is assigned as the D-band for disordered polycrystalline graphite when the laser excitation line at 514.5 nm is used; this band is shifted to 1325–1335 cm⁻¹ when the Helium-Neon laser excitation line at 647 nm is used [16,17]. The D-band is associated with the disordered or defective hexagon graphitic plane structures [11,12]. The G band at 1580–1584 cm⁻¹ is due to stretching vibrations in the basal-plane of ideal graphite [11,12]. The pair of G and D bands are considered to be the best diagnostic feature for polycrystalline graphitic materials. The Raman band for amorphous diamond-like (sp³) Carbon is at 1330 cm⁻¹ using the laser excitation line at 514.5 nm [11,12]. The Raman scattering efficiency of sp² Carbon is about 50 times larger than that of sp³ Carbon [12], and the Raman scattering from the diamond-structured sp³ Carbon is thus usually not observed in the presence of sp² Carbon structures [18]. For this discussion, the laser excitation line at 632.8 nm is used, and the sp²/sp³ Carbon ratio is larger than 2.5 after annealing—from X-ray photoelectron spectra data. Therefore, the band at 1328 cm⁻¹ in FIG. 3 is the D band, and does not change with increasing annealing temperatures.

The G-band at 1580 cm⁻¹ involves the in-plane bond-stretching motions of pairs of graphitic (sp²) Carbon structures (Carbons with $E_{2g}$ symmetry) [11], and this band does not shift when the wavelength of the laser excitation line is changed [16,17]. However, the G-band at 1580 cm⁻¹ shifts up to around 1603 cm⁻¹ for nano-size graphitic flakes [11], in which the graphitic flakes consist of hexagon rings in the order of tens [20] as shown in FIG. 6 of the present document drawings. In FIG. 3, the G-band is at 1593 cm⁻¹ for 750° C. and 925° C. annealing temperatures, at 1596 cm⁻¹ for 990° C., 1050° C. and 1150° C., annealing and at locations up to 1600 cm⁻¹ for 1250° C. and 1350° C. annealing. The annealing temperatures below 1350° C. are considered as very mild graphitization conditions, and larger graphitic layer structures should not be formed [7].

If the size of the graphitic flakes is below 1–2 nm, the order of hexagon plane structures deteriorates and the associated D band vanishes [11]. Such small amorphous aromatic Carbon clusters with the G-band at about 1580 cm⁻¹ are surrounded with sp³ Carbon structures stabilizing the structures [11]. Another sp² Carbon structure with a higher amorphization degree is polyene-like [21] or semicircle aromatic structures [22] with the broad G band at 1490 cm⁻¹. Therefore, the sp² Carbon structures consist of three structures: (a) amorphous aromatic sp² Carbon clusters at 1580 cm⁻¹ (G1), (b) nano-size graphitic flakes at 1603 cm⁻¹ (G2), and (c) the polyene-like Carbon structures (P) at 1490 cm⁻¹. The deconvoluted Raman spectra for the Carbon/Silicon Carbide samples after annealing at the Example 1 and Example 4 temperatures are shown in the FIG. 4a and FIG. 4b drawings herein.

Figure 5A:
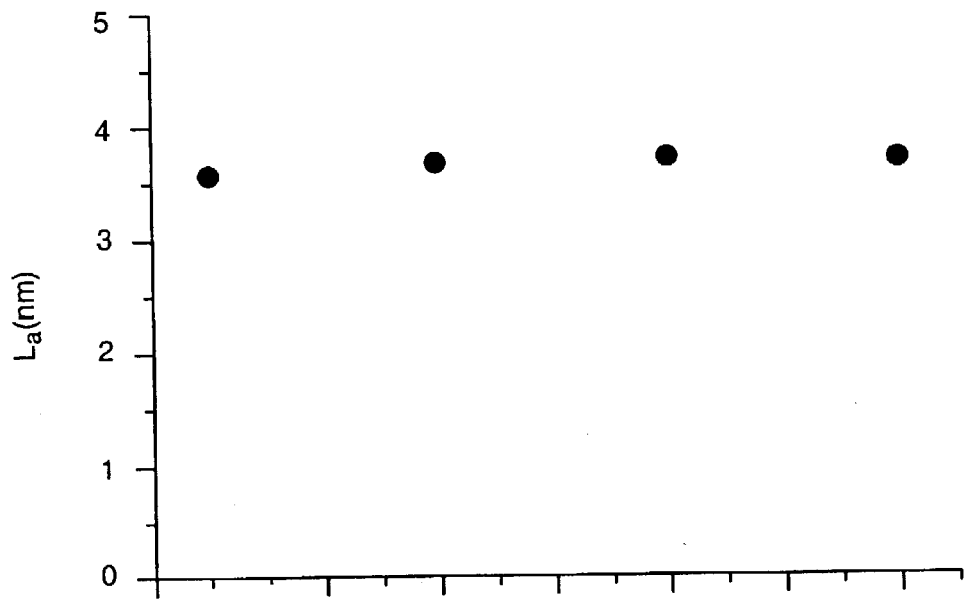
FIG. 5a shows relationship between nano-graphitic flake size and annealing temperature.
Figure 5B:
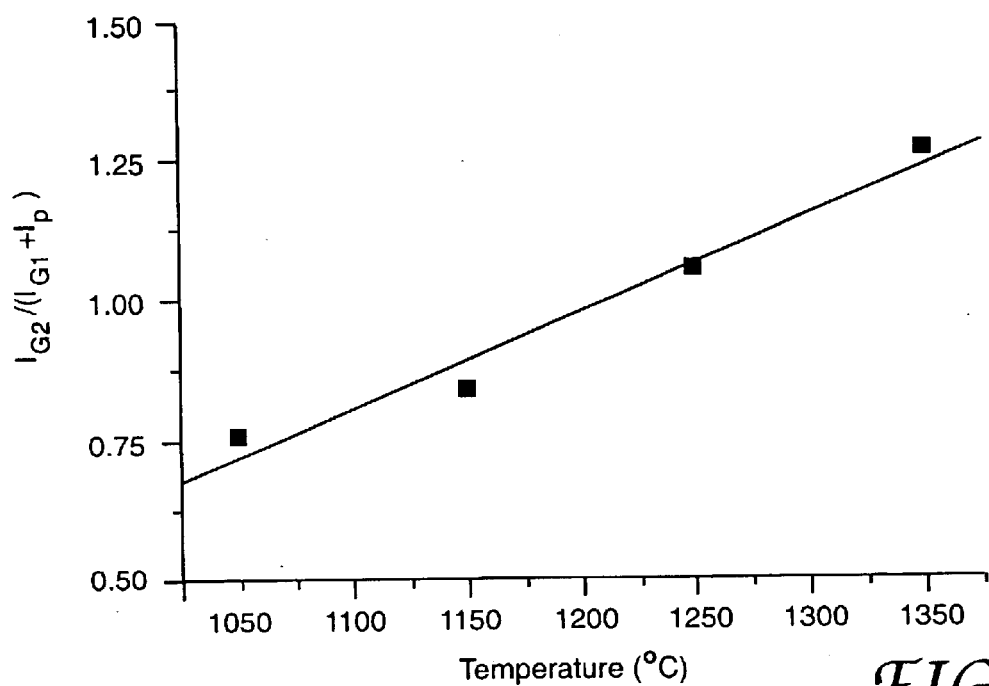
FIG. 5b shows relationship between nano-graphitic flake intensity and annealing temperature.

FIG. 5b in the drawings shows the $I_{G2}/(I_{G1}+I_P)$ intensity ratio increases with increasing temperatures. This relationship also indicates that more nano-size graphitic flakes are formed with increasing annealing temperatures. Ohmic contact is achieved at 1350° C. for the Carbon/SiC contact (see FIG. 1) while the $I_{G2}/(I_{G1}+I_P)$ ratio is about 1.25. In another words, with increasing annealing temperatures, the $I_{G2}/(I_{G1}+I_P)$ ratio increases and the ohmic contact resistance for the Carbon/SiC samples decreases. In FIG. 3, the intensities of the D-band increase with increasing temperatures, which also indicate more defected hexagonal graphitic structures are formed with increasing annealing temperature. Therefore, a Schottky contact converts into an ohmic contact when sufficient amount of nano-size graphitic-like flakes are formed during an annealing.

The size of graphitic flakes can be calculated from the intensities of the D and G bands [11,12,16]:

$$L_a = C(I_{G2}/I_D) \quad (1)$$

where $L_a$ is the size of the graphitic plane, and $I_{G2}$ and $I_D$ are the intensities of the nano-graphitic flakes and D bands. C is estimated to be [16]:

$$C = -12.6 + 0.033\, \lambda_L \quad (2)$$

Where $\lambda_L$ is the wavelength of the laser excitation line. For the Helium-Neon laser of the present disclosure, $\lambda_L$ is 632.8 nm. According to Eq. (2), C is 8.28 nm. Using Eq. (1) and the intensity ($I_{G2}$) of the band at 1603 cm⁻¹, the size of the graphitic flakes in Carbon/SiC after annealing ranges from 3.5 to 3.7 nm at the varying temperatures in FIG. 5. The calculated size of the nano-graphitic flakes in this description is consistent with the sizes of polycyclic aromatic hydrocarbons [20]; this indicates only the nano-graphitic flakes have contribution to the D-band.

It is generally considered that the first order Raman bands relate to structural orders within a graphitized sheet, and the second order bands relate to the stacking disorder along the crystallographic c-axis [23]. Since the second-order bands, i.e., the bands at 2660 cm⁻¹ in FIG. 9 do not appear in the Carbon/SiC samples, the graphitic flakes on the Carbon/Silicon Carbide have not formed the stacking structures on the c-axis after annealing from 1050° C. to 1350° C.

In conclusion, RF sputtering produces an amorphous Carbon film with the $sp^2/sp^3$ ratio of about 1. The Carbon film evolves into more graphite-like structure with increasing annealing temperatures. The $sp^2$ Carbon structures consist of amorphous aromatic-like Carbon structures, nano-size graphitic flakes, and polyene-like Carbon structures that are revealed by Raman spectroscopy. Nano-graphitic materials have demonstrated some novel electrical properties theoretically [24–26]. Examples 1–4 demonstrate that ohmic contact is formed on 4H—SiC when a sufficient amount of nano-graphitic flakes are formed at the Example 4 temperature of 1350° C. using the semiconductor doping level of $10^{18}$.

EXAMPLE 5 THROUGH EXAMPLE 13

Metal/Carbon/n-type Silicon Carbide Combinations With <1000° C. Annealing

The following described nine Examples employ differing metal materials in the formation of ohmic and non-ohmic contacts with Silicon Carbide semiconductor material. The nine Examples also differ as to the lower than Examples 1–4 annealing temperatures employed and thereby additionally attain differing degrees of success in achieving ohmic contact with the Silicon Carbide semiconductor material. The results disclosed in the following paragraphs together with an educational background in both the chemical and physics arts persuades one of the inventors named in the present document, inventor Weijie Lu, that the metals introduced in the present examples serve in a catalytic agent role in providing ohmic contact with Silicon Carbide material. While again not wishing to be bound by nor limited by this persuasion the non metal inclusive Carbon contacts achieved in Examples 1–4 above are seen as one corroboration of this catalytic agent role of the metal components in the present invention.

In the following Examples 5–13 the electrical contact properties achieved with use of metal/Carbon/4H—SiC following an annealing in vacuum for two hours at 800° C. are examined. The employed metals include Ni, Co, Cr, Ti, W, Mo, Al, Au and NiCr. Ohmic contacts are achieved with the Ni/C, Co/C, Cr/C, and NiCr/C films in this group on n-type 4H-Silicon Carbide having a doping concentration of $1.8 \times 10^{19}$ cm$^{-3}$ atoms per cubic centimeter. The Ni/C/SiC and Co/C/SiC combinations exhibit ohmic contact behavior when the SiC doping concentration is even an order of magnitude lower, i.e., at the $1.6 \times 10^{18}$ cm$^{-3}$ level. Raman spectra show direct relationships between the formation of graphitic Carbon and ohmic contact formations, and scanning electron microscopy (SEM) images exhibit a direct link between the reacted morphology and ohmic contact formation. The direct link between the reacted morphology and ohmic contact formation is explained by a generally accepted catalytic graphitization mechanism. The present nine Examples show that the catalytic graphitization activities of various metals are directly related to ohmic contact formation on Silicon Carbide.

It is well known that a Carbon phase in contact with a SiC substrate surface is formed on metal/Silicon Carbide samples after an annealing. Metals react with SiC at relatively low temperatures. Most metals react only with Si to form metal silicides, not with Carbon under these conditions. For example, nickel has been the most widely investigated metal for ohmic contacts on SiC. $Ni_2Si$ is formed on 6H—SiC at 500° C. in vacuum [16]. The resulting contact is Schottky in nature however. Ohmic contacts on Ni/SiC are formed when the annealing temperature is up to 950° C. [3, 4, 5, 27]. Kurimoto et al. [40] report that the Ni silicides, composed of $Ni_2Si$, NiSi, and $NiSi_2$, are formed at 500° C., and do not vary in the annealing temperature region of 500–1100° C. Silicon Carbide becomes chemically reactive with most metals at high temperatures. Previous studies involving some of the present inventors show that Pd has reacted with SiC at as low as 300° C. [8].

We demonstrated in FIG. 1 that the structural evolution of Carbon at high temperatures is associated with the mechanism of ohmic contact formation on SiC, and the formation of nano-size graphitic flakes plays a determinative role in ohmic contact formation of Carbon films on Silicon Carbide. Use of the Example 5 Ni as a graphitization catalyst accelerates the formation of nano-size graphitic flakes and an ohmic contact is thereby formed on Ni/C/SiC at lower temperatures. Han et al. [41,42] find that the formation of Carbon vacancies at 950° C. plays a key role in ohmic contact formation on n-type SiC. From the viewpoint of surface structures of a Silicon Carbide substrate, when the annealing temperature is above 900° C., a Silicon Carbide surface graphitizes due to the preferential volatility of silicon [43].

In the present Examples electrical contact properties of metal/Carbon/Silicon Carbide systems are considered. These Examples consider ohmic contact formation from the viewpoint of metal catalytic graphitization activities, based on study of ohmic contact formation of C/Silicon Carbide and Ni/C/Silicon Carbide. The degree of Carbon graphitization catalyzed by various metals in the films is disclosed using Raman spectroscopy and scanning electron microscopy.

Cree Incorporated n-type, on-axis 4H—SiC wafers with a doping concentration of $3.1 \times 10^{19}$ cm$^{-3}$ and a Carbon-face; and a doping concentration of $1.6 \times 10^{18}$ cm$^{-3}$ and a Silicon-face (as appear in Table 3 herein) may be used to obtain the results disclosed in the present Examples 5–13. The Silicon Carbide wafers may be cut to $8 \times 8$ mm$^2$, and cleaned by the previously described RCA method, oxidized at 1150° C. in wet oxygen to form a sacrificial oxide film, and etched by HF solution.

Transfer length method, TLM, structures may be photolithographically prepared with rectangular pads of $50 \times 100$ $\mu$m, and with space between pads of 25, 50, 75, 100, 125, and 150 $\mu$m, respectively. Carbon and metal film depositions may be performed using a DC sputtering system (DSC-300A sputterer, Denton Vacuum, Inc., Moorestown, N.J.). A pyrolytic graphite target (L.K. Lester Co.) may be used for Carbon film deposition. The thickness of the Carbon film is 2.0 nm, and the thickness of the overlying Ni film is 200 nm. 500 V may be applied for the Carbon deposition, and 450 V may be applied for the Ni deposition.

The samples may be placed in a graphite furnace (Oxy-Gon Industries, Epsom, N.H.), and annealed in high vacuum ($\sim 10^{-5-6}$ Torr) at 800° C. for two hours. Current-voltage (IV) measurements may be performed at room temperature using a MicroManipulator probe station. A Keithley 228A voltage/current source supply may be used as the source, the voltage drop between the pads may be measured by a Keithley 196 Digital Multimeter instrument, and a Keithley 197A Auto ranging Multimeter used to measure the current. The Raman spectra may be obtained with a Jobin Yvon Horiba LabRam, Infinity Raman spectrometer using the 632.8 nanometer laser excitation line. A 100× optical microscope may be used to focus on the measuring area. A JSM-5310LV scanning electron microscope, from JEOL, Peabody, Mass., may be used with 5.0 kV applied and the secondary electron detector used. The electron gun may be a standard tungsten filament and the electron beam current may be 80–85 µA. The images may be processed by a Voyage software system.

Figure 7:
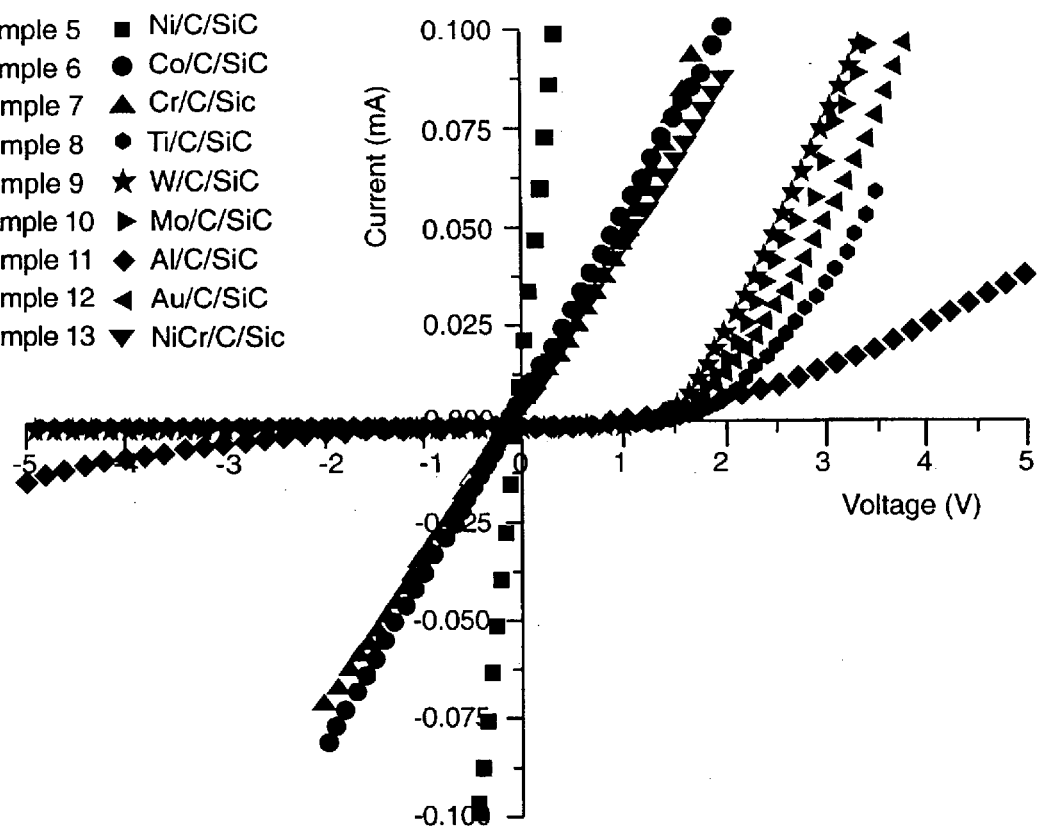
FIG. 7 shows current and voltage relationships for nine annealed metal/Carbon/n-type Silicon Carbide combinations involving a high doping concentration.

FIG. 7 shows the current-voltage curves of the Example 5–13 metal/Carbon/SiC samples after thermal annealing at 800° C. in Ar. In FIG. 7 the 4H—SiC substrate is the n-type, C-face, on-axis version, with a doping concentration of $3.1 \times 10^{19}$ cm$^{-3}$. As shown in FIG. 7, ohmic contacts are formed on the Example 5, 6, 9 and 13 four samples, the samples involving Ni/C/SiC, Co/C/SiC, Cr/C/SiC and NiCr/C/SiC. These and the other metal-inclusive samples are also associated with an Example identification number in the FIG. 7 drawing. The specific resistivities of the four samples with ohmic contact are in the order of $10^{-4}$ to $10^{-5}$ Ωcm$^2$, and are listed in Table 1 of APPENDIX 2 herein. Table 1 thus shows the specific resistivities of Metal/Carbon/4H-Silicon Carbide after annealing at 800 degrees Celsius in vacuum for two hours. The resistivity measurement current is set at 0.5 mA. The remaining five samples of Examples 5–13; i.e., Al/C/SiC, Au/C/SiC, Mo/C/SiC, Ti/C/SiC, and W/C/SiC exhibit Schottky contact behavior.

Since ohmic contact formation on metal/SiC conventionally requires annealing temperatures at 950° C. or above [3, 4, 5, 27], the results in FIG. 7 and Table 1 indicate the addition of an interfacial Carbon layer decreases the annealing temperatures required to form ohmic contact for some metals. This conclusion is significant with respect to the present invention and is in notable contrast to certain conventional wisdom in the Silicon Carbide art to the effect that the presence of Carbon is harmful to ohmic contact formation!

Figure 8:
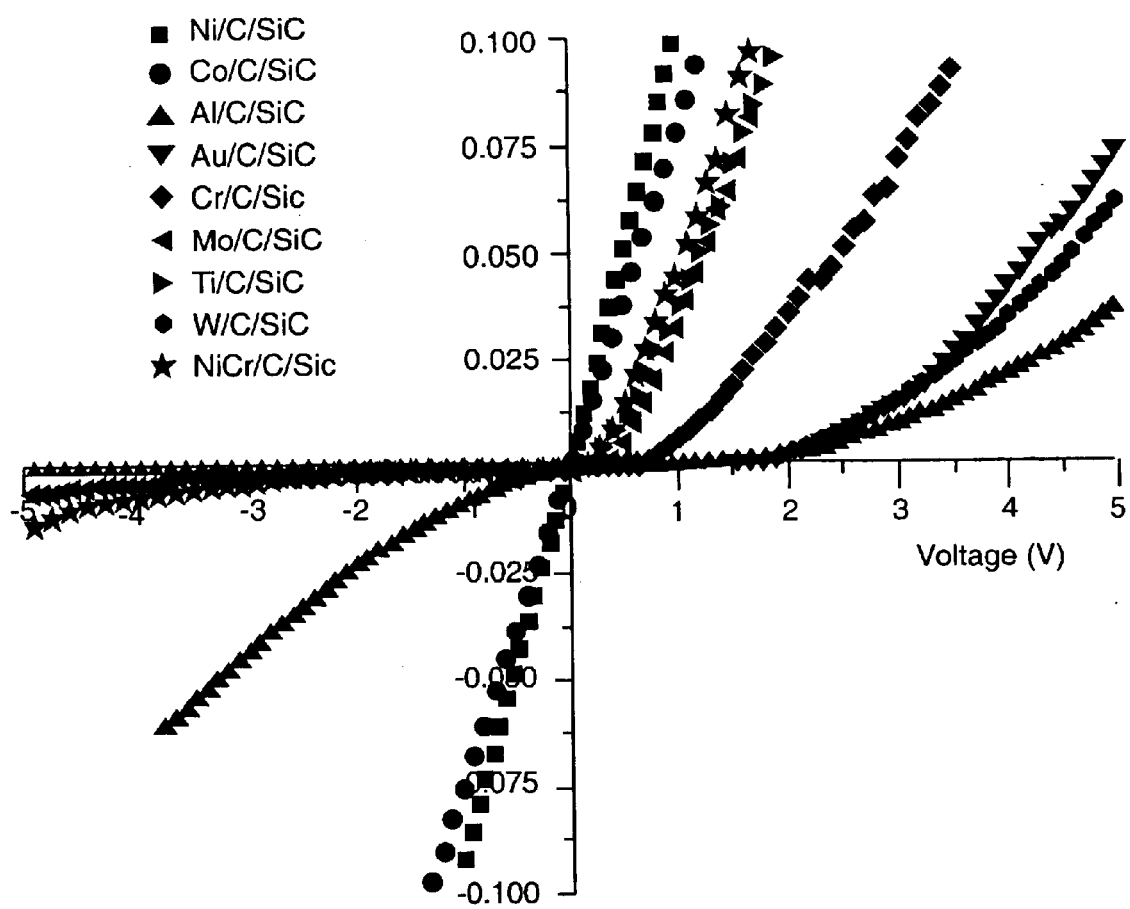
FIG. 8 shows current and voltage relationships for nine annealed metal/Carbon/n-type Silicon Carbide combinations involving lower doping concentrations.

FIG. 8 shows the current-voltage curves of nine metal/Carbon/SiC combinations of Examples 5–13 under different conditions (doping concentration of $1.6 \times 10^{18}$ cm$^{-3}$, 4H—SiC, n-type, Si-face, and on-axis) than are disclosed in the previous paragraphs. The FIG. 8 results are considered to be additional disclosure relating to the present Examples 5–13 rather than being additional examples according to the arrangement of the present patent document specification. FIG. 8 also represents characteristics after annealing in vacuum for two hours at 800° C. As shown under the totality of these different conditions only Ni/C/SiC and Co/C/SiC provide ohmic contacts, and the seven other samples provide Schottky contacts. Therefore, Ni/C and Co/C films are considered better materials for ohmic contact usage than Cr/C and NiCr/C films. Our previous results showed that the choice of Si- and C-faces of Silicon Carbide have no significant effects on ohmic contact formation of Ni/C/SiC. The doping concentration of the SiC is however yet an important factor in ohmic contact formation of metal/Carbon films on Silicon Carbide.

With respect to Raman Spectra, although it is well known that a Carbon phase exists on a metal/SiC interface after annealing, the effects of this Carbon phase on ohmic contact formation has not gained attention in the art. Our results with C/Silicon Carbide have demonstrated that nano-size graphitic flakes play a determinative role in ohmic contact formation on Silicon Carbide. It now appears that good ohmic contact is formed on Ni/C/Silicon Carbide at temperatures of 700° C. Microstructures of Carbon materials can be modified over wide ranges, and the electrical properties change with changing microstructures [24]. Graphite is an excellent conductive material and the most stable state of Carbon, and moreover the electrical resistivity of single crystal graphite is as low as at $10^{-7}$ Ωm. On the other hand, diamond, i.e., another form of Carbon, is an excellent insulator with the electrical resistivity of $10^{14}$ Ωm [44].

Structural modification of Carbon can therefore result in electrical properties varying from conductor, to semiconductor, to insulator. A graphitization process is one of such structural modifications and achieves conversion of Carbon atoms from the sp$^3$ to the sp$^2$ state, rearranges disordered Carbon atoms into graphitic layer-like structures, aligns smaller graphitic flakes together to form larger plane structures, and forms stacking structures with neighboring layers. These changes are considered beneficial for the purpose of the present ohmic contact fabrication. The electrical resistivity of the Carbon decreases with increasing the degree of graphitization. The presence of most metals has a beneficial catalytic effect and accelerates the graphitization process [45, 46].

Figure 9:
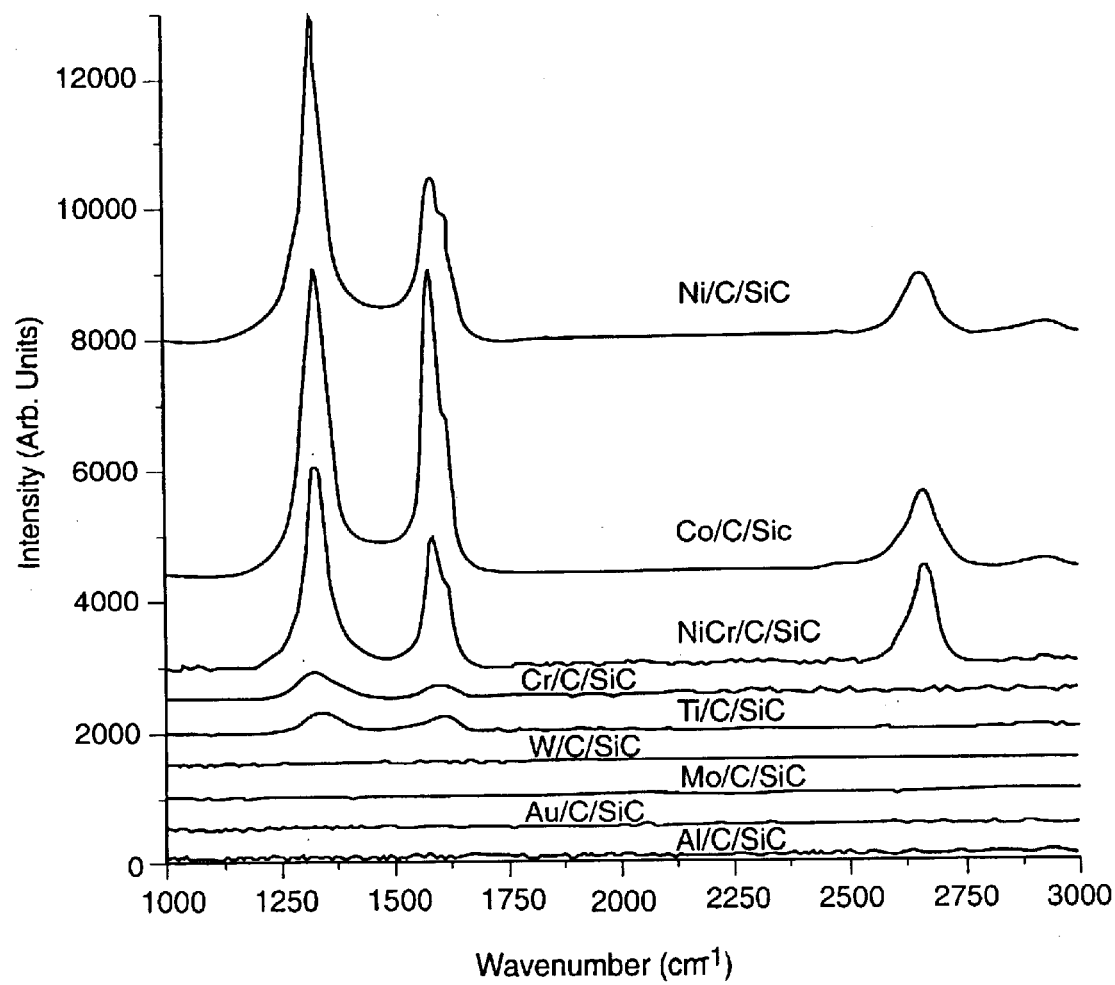
FIG. 9 shows the Raman spectra for nine annealed metal/Carbon/n-type Silicon Carbide combinations involving a high doping concentration.

Raman spectroscopy is an effective technology to investigate Carbon structures [11]. FIG. 9 in the drawings shows the Raman spectra of the present Examples 5–13 nine M/C/Silicon Carbide samples after annealing at 800° C. in vacuum for two hours. As shown, the strong bands at 1330, 1585, 2660 cm$^{-1}$, and a shoulder bands at 1620 cm$^{-1}$ exist for Ni/C/SiC, Co/C/SiC, and NiCr/C/SiC after annealing; these combinations are considered to provide favorable ohmic contact characteristics. The bands at 1330 and 1585 cm$^{-1}$ are also found to exist with weak intensities after 800° C. annealing for Ti/C/SiC and Cr/C/SiC. No Raman bands in the range from 1000 to 3000 cm$^{-1}$ are detected for the other four samples: Al/C/SiC, Au/C/SiC, W/C/SiC, and Mo/C/SiC after the 800° C. annealing.

The Raman scattering properties of Carbon materials have been well investigated [11, 12]. In disordered polycrystalline graphite, a Raman band at 1350–1360 cm$^{-1}$ is assigned as the D-band when the-excitation line at 514.5 nm is used. The D-band is associated with the disordered or defective hexagon graphitic plane structures [11, 12] with higher edge/basal proportion [47], and is always detected when the sixfold symmetry of a graphite layer is locally lost in some degree. The band at 1580–1584 cm$^{-1}$ is the G band and relates to the stretching vibrations in the basal-plane of ideal graphite [11, 12]. Existence of the pair of G and D bands in data of the FIG. 9 type is commonly regarded as the best diagnostic feature identification for polycrystalline graphitic materials.

The Raman band for amorphous diamond-like (sp$^3$) Carbon is at 1330 cm$^{-1}$ when the laser excitation line at 514.5 nm is used [11, 12]. However, the Raman scattering efficiency of sp$^2$ Carbon structures is about 50 times that of sp$^3$ Carbon structures [12, 48]. Therefore, the Raman scattering from the diamond-structured Carbon structures usually is not observed in the presence of sp$^2$ Carbon structures as is the case in the FIG. 9 data [18, 49]. When the laser excitation line at 647 nm is used, the D band is shifted to 1325–1335 cm$^{-1}$ [16, 17]. The band at 2660 cm$^{-1}$ in FIG. 9 is the secondary order Raman band related to the stacking disorder along the crystallographic c-axis [23]. Therefore, in FIG. 9 it may be observed that the three-dimensional stacking graphitic structures have been formed in the Ni/C/SiC, Co/C/SiC, and Ni/C/SiC samples. As shown in FIG. 9 therefore, graphitic structures are well formed in the Ni/C/SiC, Co/C/SiC, and NiCr/C/SiC samples, and some graphitic structures are formed in the Cr/C/SiC and Ti/C/SiC samples. No graphitic Carbon structures are however detected in the Al/C/SiC, Au/C/SiC, Mo/C/SiC, and W/C/SiC samples. The FIG. 9 laser beam is incident to the surface for all samples.

Figure 10A:
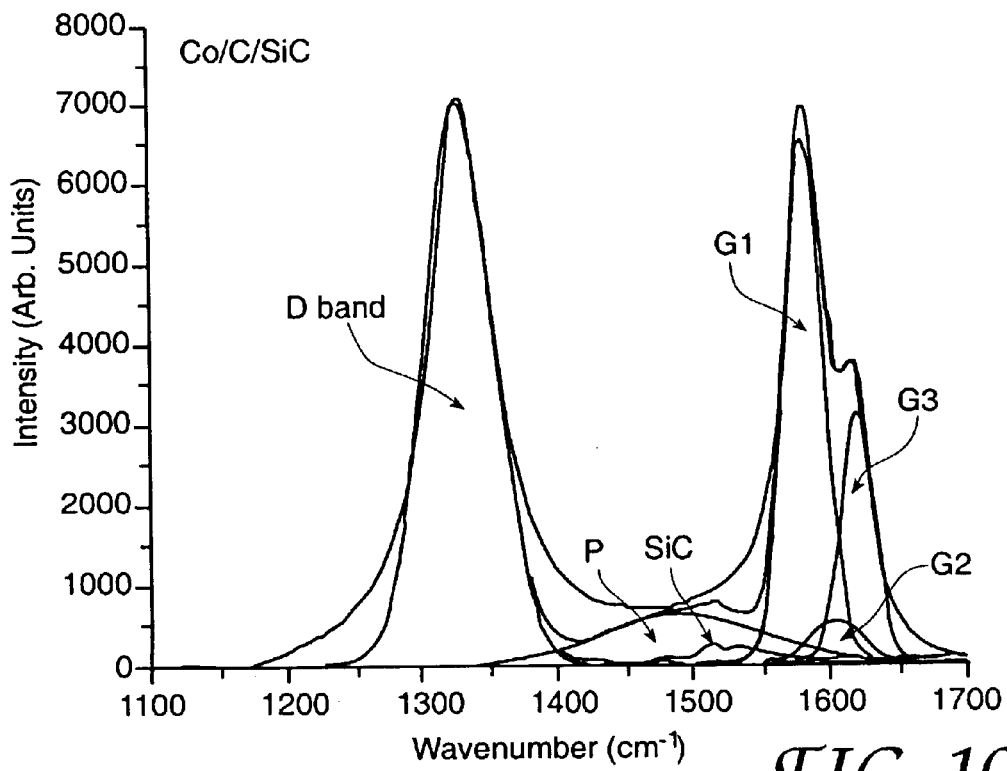
FIG. 10 shows the deconvolutions of D and G Raman spectra bands for two annealed metal/Carbon/n-type Silicon Carbide combinations.
Figure 10B:
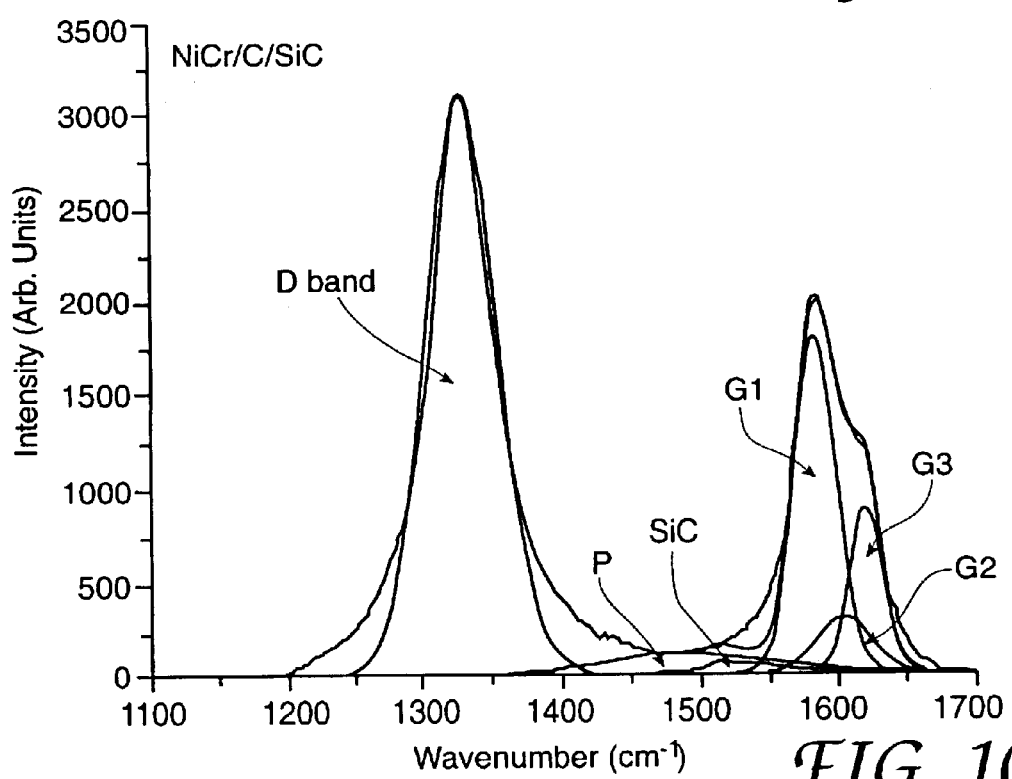

FIG. 10 shows the deconvoluted films Raman spectra in the region of the G and D bands for the Co/C/SiC and NiCr/C/SiC samples (in FIG. 10a and FIG. 10b respectively)

after annealing at 800° C. in vacuum for two hours (n-type, C-face, on-axis, and with the doping concentration of $3.1 \times 10^{19}$ cm$^{-3}$). The deconvolution method is the same as discussed with respect to Examples 1–4 above. The FIG. 10 sp$^2$ Carbon structures consist of several structures: (a) amorphous aromatic sp$^2$ Carbon clusters at 1582 cm$^{-1}$ (G1), (b) nano-size graphitic flakes at 1604 cm$^{-1}$ (G2), and (c) the polyene-like Carbon structures (P) at 1490 cm$^{-1}$. As shown in the FIG. 10 drawings, in the presence of metal, such as Ni or Co, an additional Raman band at 1620 cm$^{-1}$ also appears. The interpretation of the additional Raman band has two possibilities: metal graphite intercalation compounds (GIC) [50, 51], and the C=C bond [18]. In the Ni/SiC sample, Robbie et al. [52] have reported that Ni graphite intercalation compounds are formed after annealing. Therefore, the band at 1620 cm$^{-1}$ is believed to be metals (Ni, Co, or Cr) graphite intercalation compounds. The same results also appear for the Ni/C/SiC sample of FIG. 10b.

As shown in the FIG. 7 results, the combinations of Ni/C/SiC, Co/C/SiC, NiCr/C/SiC and Cr/C/SiC exhibit ohmic contact behavior. Graphitized Carbon structures are found by Raman spectroscopy in these four samples as is shown in FIG. 9. Therefore, we conclude ohmic contact formation in M/C/SiC samples has a direct relationship to the degree of graphitization of the Carbon phase. The results in these examples 5–13 thus clearly demonstrate that the formation of graphitic Carbon structures has an important role in the ohmic contact formation on SiC, and supports our previous conclusion that metals as catalysts accelerate the graphitization process. The existence of a Carbon phase on M/SiC after annealing has however heretofore been considered harmful to ohmic contact formation [4]. Several studies have in fact used metal silicides, carbides, and nitrides films on SiC to reduce the amount of Carbon present. However, these studies have shown no improvements to form ohmic contact using non-reactive film materials, and annealing temperatures at 950° C. or above are yet required to form ohmic contact on the SiC [29–36]. In addition, a Carbon phase continues to form in these processes since the SiC surface graphitizes after annealing above 900° C. even using non-reactive film materials [43].

Figure 11:
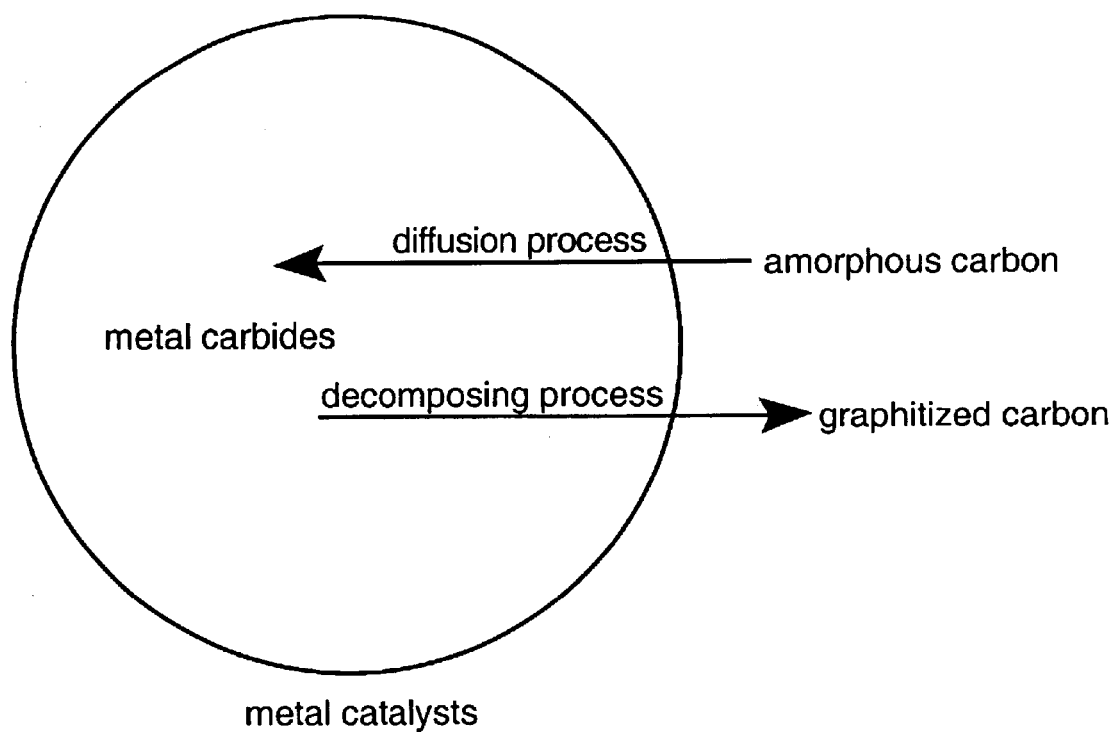
FIG. 11 shows the carbide formation-decomposition mechanism of catalytic graphitization.

Morphological Features and Catalytic Graphitization Activities of Various Metals Catalytic graphitization by metals was extensively investigated in 1960's to late 1970's [45, 46, 53]. A generally accepted mechanism for catalytic graphitization involves carbide formation-decomposition according to which amorphous Carbon diffuses in the metal catalyst particles, forms carbides, and then the carbides decompose to graphitized Carbon structures. Another mechanism involves Carbon dissolution-precipitation controlled by the solubility of Carbon in the metal. In both mechanisms, the driving force for graphitization is the decrease of free energy by the conversion of amorphous Carbon structures to graphitized Carbon structures [53]. FIG. 11 shows the carbide formation-decomposition graphitization process in a pictorial representation. Based on the described mechanisms, the reactions and diffusion processes cause surface tension changes on the films and result in dynamic changes on the morphological features of the films.

Figure 12A:
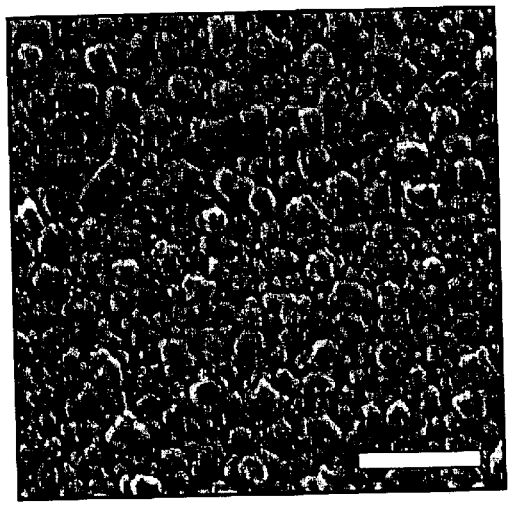
FIG. 12a shows a scanning electron microscope image of an annealed surface of one metal/Carbon/n-type Silicon Carbide combination.
Figure 12B:
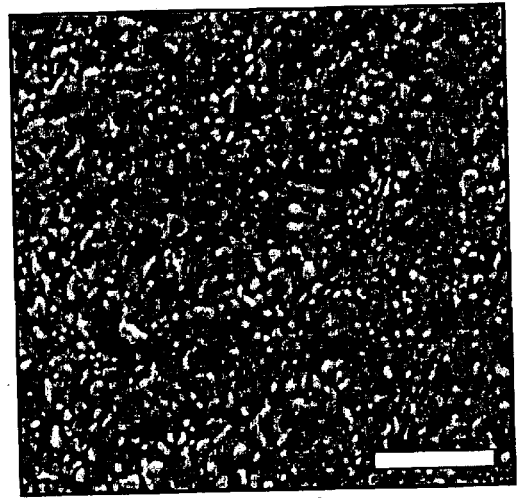
FIG. 12b shows a scanning electron microscope image of an annealed surface of another metal/Carbon/n-type Silicon Carbide combination.
Figure 12C:
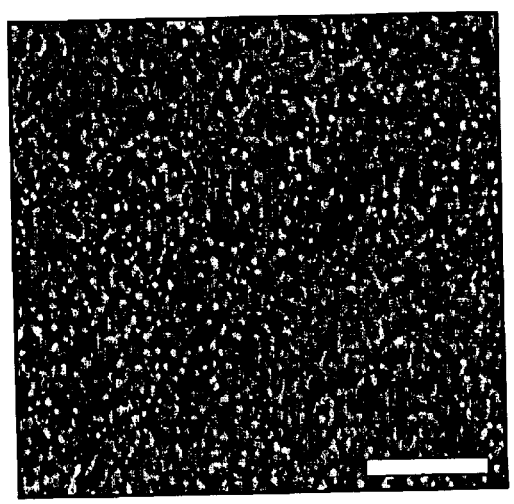
FIG. 12c shows a scanning electron microscope image of an annealed surface of another metal/Carbon/n-type Silicon Carbide combination.
Figure 12D:
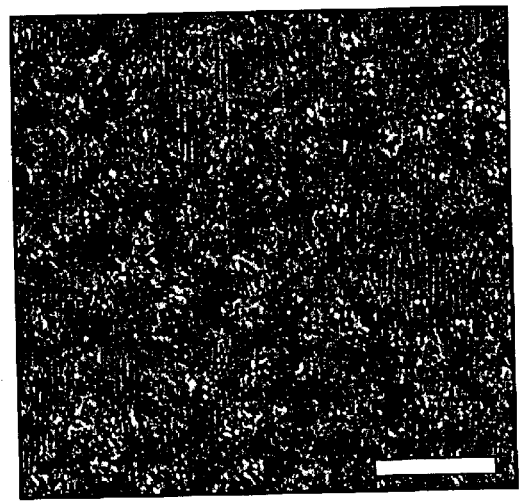
FIG. 12d shows a scanning electron microscope image of an annealed surface of another metal/Carbon/n-type Silicon Carbide combination.

The conventional un-catalyzed graphitization for forming highly graphitized structures take place in the temperature region of 2000–3000° C. [7]; this is much higher than the temperatures for ohmic contact formation on SiC. It is known however that some metals, such as Ni, Co, Fe, have catalytic graphitization effects at low temperatures, temperatures in the range of those usable for ohmic contact formation on SiC. Ni, Co, and Fe are known as excellent catalysts for synthesizing Carbon nano-tubes and nano-fibers in the temperature range of 600–800° C. [54,55] for example. FIG. 12 shows in the views of FIG. 12a, FIG. 12b, FIG. 12c and FIG. 12d the surface morphology of the four samples, Ni/C/SiC, Co/C/SiC, NiCr/C/SiC and Cr/C/SiC after annealing in vacuum at 800° C. These morphologies are shown in the form of scanning electron microscope originated photographs. These four samples form ohmic contact as is shown in FIG. 7. As shown in FIG. 12, the morphology of the films becomes coarse, and many rounded features are formed during the annealing. The Ni/C/SiC combination of FIG. 12a provides the best ohmic contact and has the roughest surface, in which the film is broken into rounded features. The diffusion of Carbon structures and the reactions of carbide formation and decomposition in the metal particles cause the surface tension changes and result in the rough surface with the rounded features shown in FIG. 12. It appears that better graphitization catalysts result in more dynamic changes in the morphology.

According to the mechanism of metal catalytic graphitization as shown in FIG. 5, the catalytic graphitization process takes place when carbides decompose. Two factors: the thermal stability of the carbide and Carbon diffusibility (or solubility) in the metal, determine the graphitization process. Table 2 in APPENDIX 2 herein lists the enthalpy, $\Delta H$, and free energy, $\Delta G$, for various carbides. As related in this table, Ni$_2$C and Co$_2$C are thermally unstable. Therefore, Ni$_2$C and Co$_2$C decompose immediately to form graphitized Carbon structures at low temperatures, and as a result Ni/C/SiC and Co/C/SiC exhibit good ohmic contacts. As also shown in Table 2 Cr$_3$C$_2$ has small negative values of enthalpy and free energy. Therefore, Cr is not a good catalyst when compared to Ni and Co. FIG. 8 shows that Cr/C/SiC and NiCr/C/SiC do not exhibit ohmic contact after annealing on SiC of a lower $1.6 \times 10^{18}$ cm$^{-3}$ doping concentration. From the Carbon solubility in metals [69], as shown in Table 2, Carbon has the largest solubility in Ni and Co. The results again support our results that ohmic contact is formed on SiC when sufficient amount of nano-graphitic flakes are formed.

FIG. 13 in the drawings shows the scanning electron microscope-observed surface morphology of the two Al/C/SiC and Ti/C/SiC samples of examples 8 and 13 herein after annealing in vacuum at 800° C. for two hours. The doping in the Silicon Carbide of these samples is at the $3.1 \times 10^{19}$ cm$^{-3}$ level. As shown, the surface morphology of Al/C/SiC and Ti/C/SiC are coarse. In these samples Al and Ti are reactive with Carbon to form Al$_4$C$_3$ and TiC however, Al$_4$C$_3$ and TiC have large negative values of enthalpy and free energy as shown in Table 2, so they are thermally stable. Therefore, Carbon structures exist in the carbide states, the graphitization is not well proceeded, and ohmic contact is not formed with the Al/C/SiC and Ti/C/SiC samples.

Figure 14A:
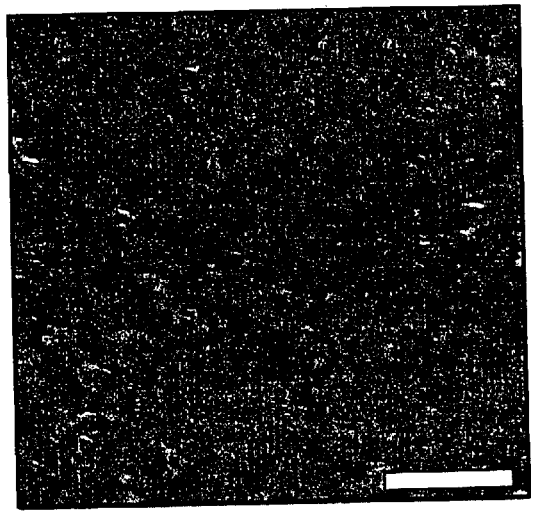
FIG. 14a shows a scanning electron microscope image of an annealed surface of another metal/Carbon/n-type Silicon Carbide combination.
Figure 14B:
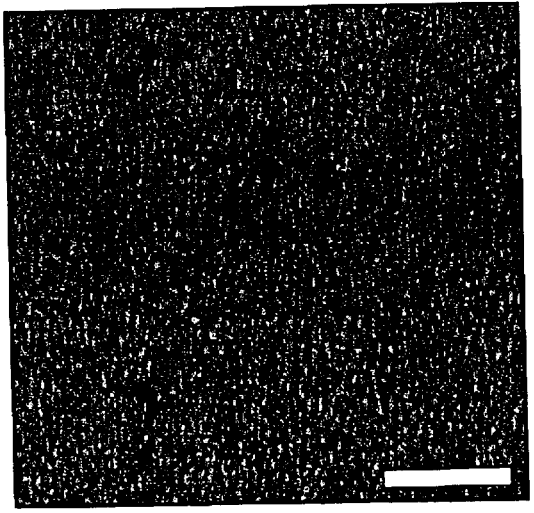
FIG. 14b shows a scanning electron microscope image of an annealed surface of another metal/Carbon/n-type Silicon Carbide combination.
Figure 14C:
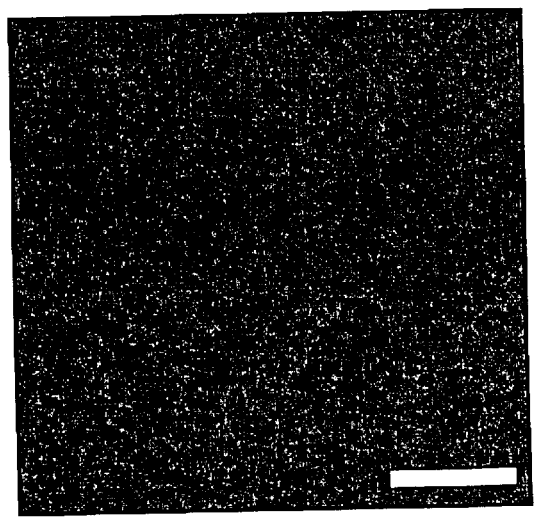
FIG. 14c shows a scanning electron microscope image of an annealed surface of another metal/Carbon/n-type Silicon Carbide combination.

FIG. 14 in the drawings shows in the views of FIG. 14a, FIG. 14b and FIG. 14c the SEM images of Mo/C/SiC, W/C/SiC, and Au/C/SiC surfaces, i.e., Examples 10, 9 and 12 herein, after annealing in vacuum at 800° C. for two hours. The doping in the Silicon Carbide of these samples is at the $3.1 \times 10^{19}$ cm$^{-3}$ level. As shown, there are no significant changes in the morphology for these samples after annealing. Although Mo$_2$C and WC have small negative values of enthalpy and free energy as shown in Table 2, they are unstable. In view of the high melting temperatures of W (3410° C.) and Mo (2610° C.) and the chemical inertness of Au, the diffusion of Carbon into these metals is difficult. Therefore, little graphitization process takes place in these samples at 800° C., and ohmic contacts are not formed as is shown in the FIG. 7 and FIG. 8 drawings.

The catalytic graphitization mechanism by metals therefore well explains ohmic contact behavior of various metals on SiC. The results in FIG. 12 through FIG. 14 reveal the relationships between Carbon diffusibility and thermal stability in these metal carbides and the electrical properties on SiC, and support the proposed mechanism that the formation of nano-graphitized flakes is the determinative factor in forming ohmic contacts.

EXAMPLES 14 THROUGH 18

Ni/C60/4H-n-type SiC Ohmic Contact

Examples 14–18 concern Ni/C60 film contact formation on n-type 4H—SiC. In these Examples a C60 interfacial layer between an initial Ni film and SiC improves ohmic contact properties significantly. Nickel is in fact a catalyst for graphitization in the reaction of these examples and moreover in the Ni/C60 material Nickel enables decomposition of the C60 Carbon at lower temperatures. Nickel also reacts with the Silicon of the Silicon Carbide to form Ni/Silicides. In the present Examples the C60 Carbon film may be deposited on the Silicon Carbide by the Langmuir-Blodgett method [63–65] prior to Ni film deposition by the DC sputtering method. As shown by Example 16 a high quality ohmic contact of Ni/C60/4H—SiC may be formed after annealing at 800° C. in Ar for two hours. The achieved contact provides a specific resistivity of $1.6 \times 10^{-6}$ $\Omega cm^2$ on SiC having a doping concentration of $1.8 \times 10^{19}$ $cm^{-3}$ ions per cubic centimeter. The Raman spectra of the contact region reveals the formation of graphitic Carbon structures by Ni catalytic effects and indicates the formation of an ohmic contact on the SiC. The Raman spectra also show nano-size graphitic flakes play a key role in the ohmic contact formation on SiC.

Carbon graphitization is strongly depended on the structures of the starting Carbon materials [1]. Fullerenes (C60) has a spherical shaped structure with the diameter of approximately 1 nm [57] and has been widely applied as a prototype nanostructure [24,58]. C60 is thermally stable in solid-state form up to 800° C. [59]. The presence of metals, such as Ni, decreases the thermal stability of C60 [60–62]. Under such conditions C60 decomposes as graphitized flakes at high temperatures. Since each Carbon atom in C60 is in the $sp^2$ state and bonded with three other Carbon structures, the graphitization process on the SiC surface starts with $sp^2$ Carbon structures using C60 as an interfacial layer, instead of starting from a $sp^3/sp^2$ mixed Carbon film prepared by sputtering. The electrical contact behavior of Ni/C60/SiC and the interactions between Ni, C60, and SiC are considered in the present Examples 14–18.

Examples 14–18 involve one Cree Inc. n-type, 4H—SiC wafer with doping concentration of $1.8 \times 10^{19}$ $cm^{-3}$ and 8° off axis surface. The SiC wafer may be cut to 8×8 $mm^2$, cleaned by the RCA method described above, oxidized at 1150° C. to form a sacrificial oxide film, and etched by HF solution. The C60 Carbon material may be purchased from the Southern Chemical Group LLC. A spreading solution may be formed by dissolving C60 in toluene to a concentration of 0.05 mg/ml. 1.84 ml of the C60 toluene solution is dropped on the surface of a water container (269 $cm^2$). After 20 minutes for the solvent to be evaporated, a floating C60 film is formed. The cleaned SiC may be vertically dipped into this C60 film, and then placed in an oven at 110° C. for 30 minutes.

For Examples 14–18 TLM (transfer length method) structures may be prepared photolithographically. The size of the rectangular pads in these structures may be 50×100 $\mu m$, and the space between pads 25, 50, 75, 100, 125, and 150 $\mu m$, respectively. Ni deposition may be performed using a DC sputtering system (DSC-300A sputter, Denton Vacuum, Inc.) with 450 V applied. After the photoresist is removed by acetone, $CS_2$ may be used to remove the C60 film between the pads.

The resulting samples may be placed in a graphite furnace (Oxy-Gon Industries, Epsom, N.H.), and annealed in high purity Argon ($O_2$<1 ppm) at selected temperatures for selected times. Current-voltage (IV) measurements may be performed at room temperature using a MicroManipulator probe station. A Keithley 228A instrument may be used as a direct current source, the voltage drop between the pads measured by a Keithley 196 instrument, and a Keithley 197A instrument used to measure the current.

Figure 15:
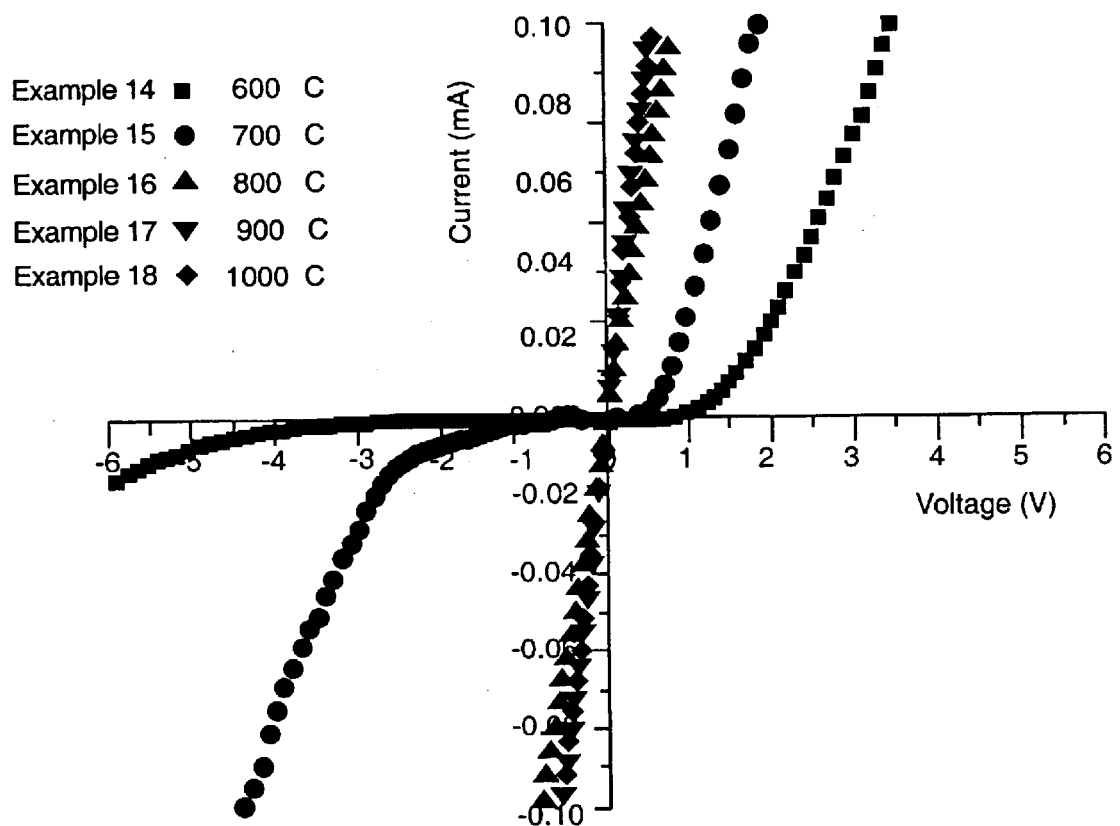
FIG. 15 shows current and voltage relationships for identified examples of Ni/C60/4H Carbon/n-type Silicon Carbide after annealing at different temperatures.

FIG. 15 shows the current-voltage (I-V) curves of Ni/C60/4H—SiC after annealing in Ar for 2 hours at the indicated temperatures. FIG. 15 also identifies the sample numbers with the annealing temperature used. As shown in FIG. 15, the Example 14 I-V curve exhibits a large reverse current leakage after annealing at 600° C. At the Example 16 annealing temperature of 800° C. however, an ohmic contact is formed. The specific resistivity achieved in Examples 16–18 when measured by the transfer length method are $1.17 \times 10^{-6}$ $\Omega cm^2$ at 800° C., $1.01 \times 10^{-5}$ $\Omega cm^2$ at 900° C., and $1.08 \times 10^{-5}$ $\Omega cm^2$ at 1000° C. respectively.

C60 is thermally stable below 800° C. without the presence of catalyst [59]. With increasing temperatures, the C60 structure starts to collapse at about 800° C., and small hexagonal Carbon planes of several nanometers size are found at 900–1000° C. With continuing temperature increase, the development of stacked layers starts to show periherical layers above 1800° C. With the presence of catalytic Ni however, the C60 structure starts to collapse at lower temperatures. Such interactions between C60 and Ni have been investigated by several groups [60–62, 66].

From the FIG. 15 results it may be observed that a C60 interfacial film between Ni and SiC significantly decreases the ohmic contact formation temperature especially with respect to the results observed in examples 1–4 above herein. The interactions between C60, Ni, and SiC appear however to be complicated. Pure C60 is thermally stable up to 800° C. At 900–1000° C., decomposed C60 forms hexagonal planes of several nanometers size with no orientation in their arrangement [5]. Heat-treatment above 1300° C. results in the formation of stacking structures. With the presence of metals, the decomposition temperature of C60 decreases significantly [60–62]. C60 decomposes at 420° C. on Ni and at 290° C. on Pt, respectively [60]. Saltas et al. [66] report that C60 is partially decomposed at 380° C. on a Ni (110) surface, and is completely decomposed at 430° C.

Figure 16:
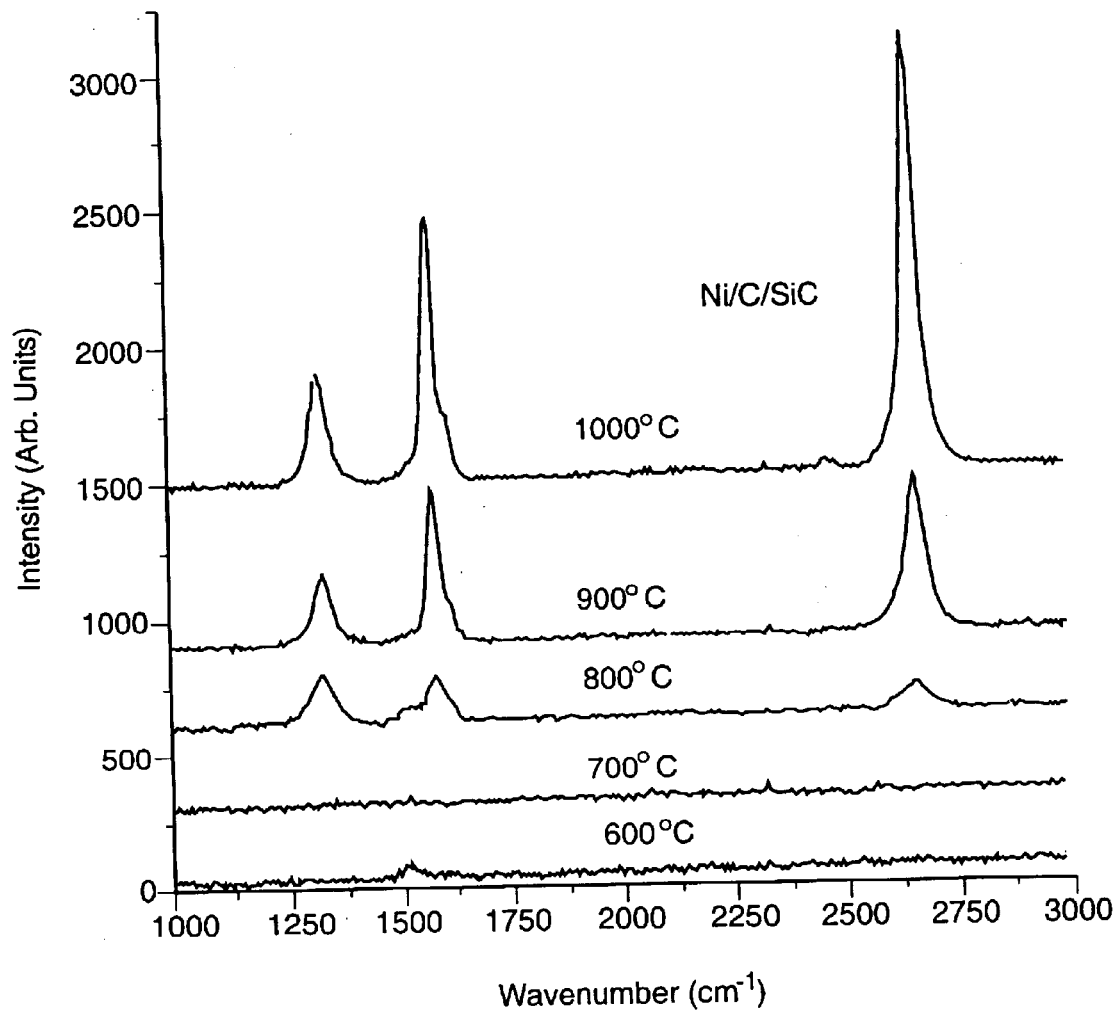
FIG. 16 shows Raman Spectra of Ni/C60/4H Carbon/n-type Silicon Carbide after annealing at different temperatures.

FIG. 16 in the drawings shows the Raman spectra of the Ni/C60/4H—SiC samples of Examples 14 through 18 after annealing at the selected temperatures in Ar for 2 hours. As shown, there is a small Raman band at 1527 $cm^{-1}$ formed with the 600° C. and 700° C. annealings. The Raman band of C60 is at 1470 $cm^{-1}$[67]; since C60 decomposes in the presence of a Ni film below 600° C. and 700° C. this C60 band does not appear in the FIG. 16 curves. When the annealing temperature increases to 800° C., the D band at 1330 $cm^{-1}$ and the G-band at 1593 $cm^{-1}$ are formed. The secondary Raman band of graphitic Carbon at 2760 $cm^{-1}$ is also formed at the higher temperatures, which indicates the graphitic structures have evolved from two-dimensional to three-dimensional configurations. At the annealing temperatures of 900 and 1000° C., the intensity of the G-band increases and the position shifts slightly to 1584 cm$^{-1}$. The secondary Raman band at 2660 cm$^{-1}$ also increases significantly at the higher temperatures, indicating the C60 is already decomposed. However, the increase of three-dimensional features when the annealing temperatures are above 800° C. does not improve the ohmic contact quality as can be observed in the FIG. 15 drawing.

EXAMPLES 19 THROUGH 40

Ni/C Film Ohmic Contact Formation on Various 4H-n-type SiC Surfaces

Various n-type 4H—SiC substrates are considered in these Examples; the results appear in Table 3 of APPENDIX 2 herein. In the Table 3 data respective Example numbers between 19 and 40 are assigned to successfully achieved Ohmic contact resistivity values in a left to right and top to bottom sequence. In this sequence Example 19 for instance relates to the 700° C. 1.44E-4 resistivity value and Example 40 to the 1000° 5.75E-4 value. Table 3 includes data relating to differing annealing temperatures, differing semiconductor faces and differing semiconductor doping levels.

From the Table 3 data it may be observed that Ohmic contact formation on SiC with Si-faces but differing tilted surfaces provides similar results. For the C-face and Si-face SiC, ohmic contact is formed at the same annealing temperature when the doping concentration is the same, but the specific resistivity is lower for Si-face SiC at 700–800° C. From Table 3 it may be observed that the doping concentration is an important factor in ohmic contact formation for all types of SiC. It may also be observed that the annealing temperatures for ohmic contact formation increase with decreasing doping concentrations.

EXAMPLE 41

Carbon Film Ohmic Contacts on 6H n-type SiC Surface

Figure 18:
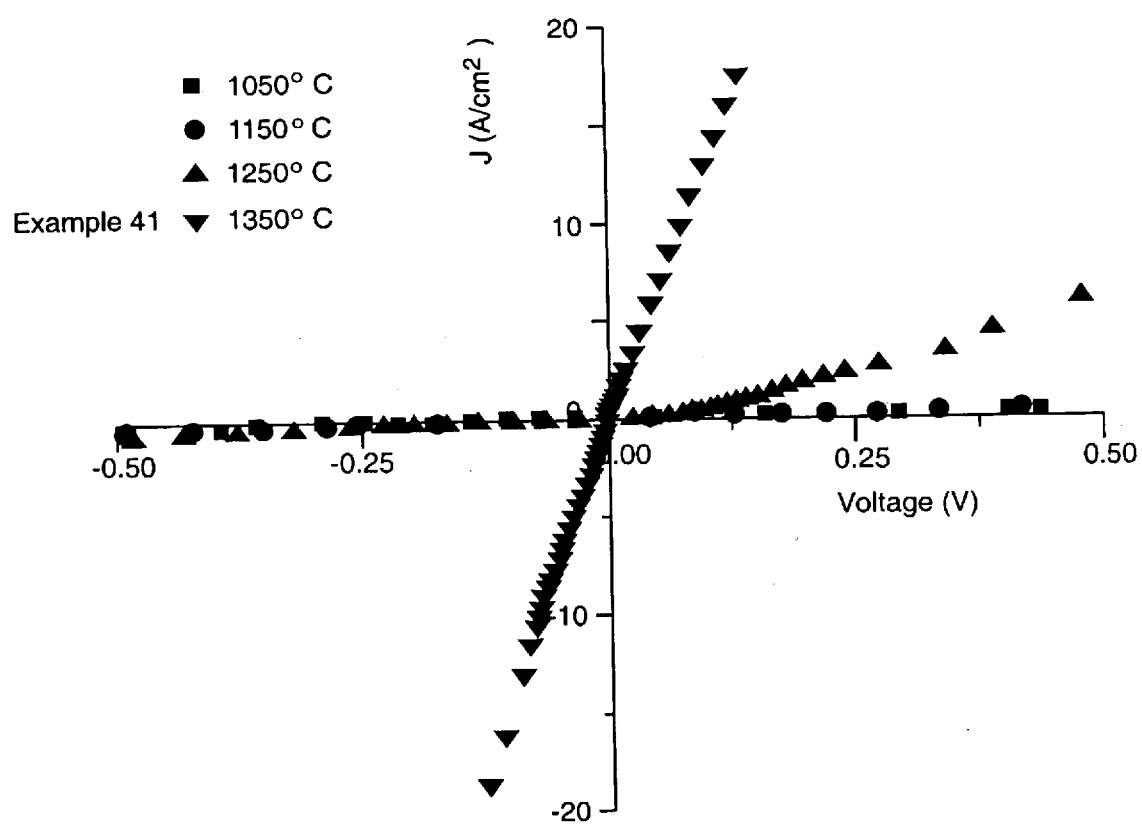
FIG. 18 shows current and voltage relationships for an Example 41 6H Carbon/n-type Silicon Carbide contact after annealing.

FIG. 18 in the drawings shows current-voltage curves for an Example 41 and related Carbon/6H—SiC samples of the n-type. The FIG. 18 samples have a Nitrogen doping concentration of 2.2×10$^{18}$ atoms/cm$^{-3}$ and provide ohmic contact after being annealed at various temperatures in Ar for 30 minutes. As shown by most of the curves in FIG. 18 many of the 6H samples show Schottky contact behavior when the annealing temperature is in the range from 1050° C. to 1250° C. Ohmic contact is however formed after annealing at 1350° C. as appears in the Example 41-identified substantially straight-line curve. Generally, from the I-V curves in FIG. 18 we conclude that 6H Silicon Carbide ohmic contact formation requires higher temperatures for lower doping concentrations of the SiC substrate.

Figure 19:
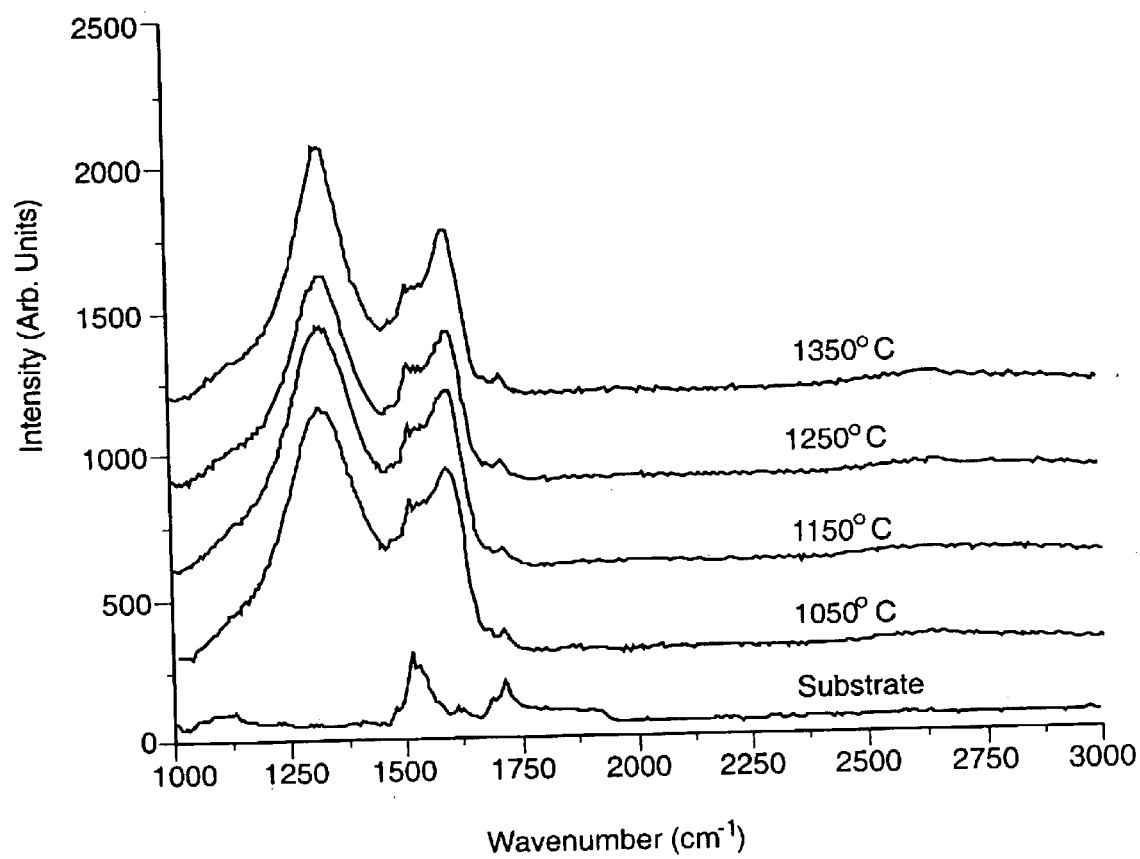
FIG. 19 shows Raman Spectra for the 6H Carbon/n-type Silicon Carbide contact of Example 41 after annealing at different temperatures.

It is well known that a Carbon phase in contact with the SiC substrate surface is formed on metal/SiC samples after annealing. Using a XPS (X-ray photoelectron spectroscopy) depth profile analysis technique, Carbon in the graphitized state is present in the whole contact layer with a maximal concentration at the interface on Ni/6H—SiC after thermal annealing [71,75]. A similar Carbon phase at the interface is also found in Co/SiC using TEM (transmission electron microscopy) [72]. Porter et al. [73] find that amorphous Carbon particles with a diameter of 2–3 nm and an irregular shape contain a trace amount of Pt in Pt/SiC contacts after annealing using TEM. Therefore, ohmic contact formation of Carbon films on SiC as shown in Example 41 and FIG. 18 indicates that the Carbon phase formed on the interface after annealing is associated with the mechanism of ohmic contact formation on SiC, and not with degradation of the contact FIG. 19 in the drawings shows the Raman spectra for the Carbon/6H—SiC samples with doping concentration of 2.2× 10$^{18}$ cm$^{-3}$ after annealing from 1050° C. to 1350° C. for 30 minutes in Ar. Again, the D band at 1330 cm$^{-1}$ does not change with increasing temperatures, and the G band at 1598 cm$^{-1}$ after annealing at 1050° C., increases slightly to 1600 cm$^{-1}$ at 1150° C., and to 1602 cm$^{-1}$ at 1250° C. and 1350° C. From FIG. 19 and the previous similar drawings for 4H samples herein, it may be appreciated that the Raman spectra of Carbon films on 4H—SiC and 6H—SiC are very similar, which indicates that polytypes of SiC have no effects on the structural evolutions of Carbon films in annealing.

It is generally considered that first order Raman bands relate to structural orders within a graphitized sheet, and the second order bands related to the stacking disorder along the crystallographic c-axis [23]. Since the second-order bands do not appear in the Carbon/SiC samples in FIG. 19, the graphitic flakes on the Carbon/SiC have not formed the stacking structures on the c-axis after annealing from 1050° C. to 1350° C.

Figure 20A:
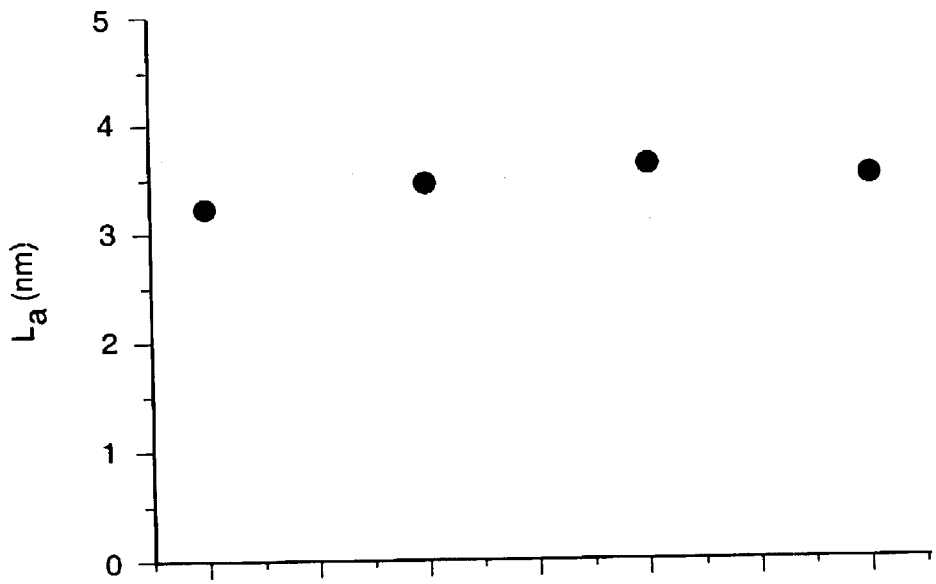
FIG. 20a shows relationship between nano-graphitic flake size and annealing temperature for the 6H Carbon/Silicon Carbide contact of Example 41.
Figure 20B:
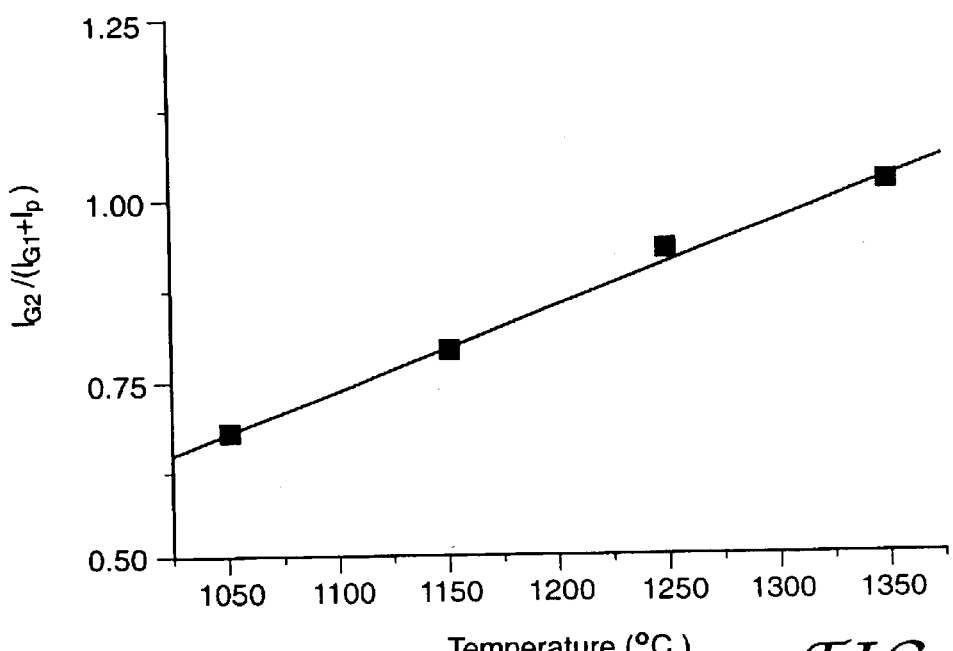
FIG. 20b shows relationship between nano-graphitic flake intensity and annealing temperature for the 6H Carbon/n-type Silicon Carbide contact of Example 41.

The structural states of Carbon films on 6H—SiC are shown in the drawings of FIG. 20 herein. FIG. 20*a* in these drawings shows the size of nano-graphitic flakes on Carbon/6H Silicon Carbide. As shown in the intensity ratios of FIG. 20*b* in these drawings, the $I_{G2}/(I_{G1}+I_p)$ intensity ratio increases from 0.68 at 1050° C. to 1.01 at 1350° C. More nano-size graphitic flakes on 6H—SiC are thus formed with increasing annealing temperatures as on 4H—SiC. From FIG. 20, the structural state of the Carbon film on a 6H—SiC substrate is similar to that of 4H SiC in the annealing temperatures range from 1050–1350° C.

Conclusions

The present invention is therefore believed to provide significant advantages in achieving good ohmic contact with n-type Silicon Carbide while using lower contact fabrication temperatures. These benefits are achieved through the formation of graphitic Carbon structures in the contact and may be aided through the use of metal such as Nickel as a catalyst to accelerate the graphitic Carbon structure formation. With a nano-structured graphitic interfacial layer, the annealing temperature for ohmic contact formation on Ni/Carbon/SiC is about 300° C. lower than in the conventional technique. Excellent ohmic contact can be formed on n-type SiC with 2 orders of magnitude lower doping concentration than in the conventional technique of Ohmic contact formation.

The foregoing description of the preferred embodiment has been presented for purposes of illustration and description. It is not intended to be exhaustive or to limit the invention to the precise form disclosed. Obvious modifications or variations are possible in light of the above teachings. The embodiments are chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

APPENDIX 1

References
(Each Document is Hereby Incorporated by Reference Herein)

[1] G.-B. Gao, J. Sterner, and H. Morkoc, *IEEE Trans. Electron Dev.*, 41, 1092 (1994).
[2] R. J. Trew, in *Semiconductors and Semimetals*, edited by Y. S. Park, (Academic Press, San Diego, Calif., 1998), Vol. 52, Chap. 6, p.237.
[3] V. Saxena, and A. J. Steckl, in *Semiconductors and Semimetals*, edited by Y. S. Park, (Academic Press, San Diego, Calif., 1998), Vol. 52, Chap. 3, p.77.
[4] J. Crofton, L. M. Porter, and J. R. Williams, *Phys. Stat. Sol.(b)*, 202, 581 (1997).
[5] L. D. Madsen, *J. Electr. Mater.*, 30, 1353 (2001).
[6] J. Crofton, P. G. McMullin, J. R. Williams, and M. J. Bozack, *J. Appl. Phys.*, 77, 1317 (1995).
[7] D. B. Fischbach, in *Chemistry and Physics of Carbon*, edited by P. L. Walker, Jr., (Marcel Dekker, New York, 1971), vol.7, p.1–105.
[8] W. J. Lu, D. T. Shi, A. Burger, and W. E. Collins, *J. Vac. Sci. Technol., A*, 17(4), 1182 (1999).
[9] *"Handbook of X-Ray Photoelectron Spectroscopy"*, edited by C. D. Wagner et al., Perkin-Elmer Co., Eden Prairie, Minn., 1979.
[10] B. K. Tay, X. Shi, H. S. Tan, and D. H. C. Chua, *Surf. & Interface Anal.*, 28, 231 (1999).
[11] A. C. Ferrari, and J. Robertson, *Phys. Rev. B*, 61, 14095 (2000).
[12] D. S. Knight, and W. B. White, *J. Mater. Res.*, 4, 385 (1989).
[13] N. H. Cho, D. K. Veirs, J. W. Ager III, M. D. Rubin, C. B. Hopper, and D. B. Bogy, *J. Appl. Phys.*, 71, 2243 (1992)
[14] S. Schelz, T. Richmond, P. Kania, P. Oelhafen, and H.-J Güntherodt, *Surf. Sci.*, 359, 227 (1996).
[15] J. C. Burton, L. Sun, F. H. Long, Z. C. Feng, and I. T. Ferguson, *Phys. Rev. B.*, 59, 7282 (1999).
[16] M. J. Matthews, M. A. Pimenta, G. Dresselhaus, M. S. Dresselhaus, and M. Endo, *Phys. Rev. B.*, 59, R6585 (1999).
[17] V. Mennella, G. Moaco, L. Colangeli, and E. Bussoletti, Carbon, 33, 115 (1995).
[18] A. C. Ferrari, and J. Robertson, *Phys. Rev. B.* 64, 75414 (2001).
[19] M. P. Siegal, D. R. Tallant, L. J. Martinez-Miranda, J. C. Barbour, R. L. Simpson, and D. L. Overmyer, *Phys. Rev. B.* 61, 10451 (2000).
[20] C. Mapelli, C. Castiglioni, E. Meroni, and G. Zerbi, *J. Molecular Struct.*, 480–481, 615 (1999).
[21] H. Darmstadt, L. Sümmchen, J.-M. Ting, U. Roland, S. Kallaguine, and C. Roy, Carbon, 35, 1581 (1997).
[22] J. Schwan, S. Ulrich, V. Batori, H. Ehrhardt, and S. R. P. Silva, *J. Appl. Phys.* 80, 440 (1996).
[23] P. Lespade, R. Al-Jishi, and M. S. Dresselhaus, Carbon, 20, 427 (1982).
[24] M. S. Dresselhaus, *Annu. Rev. Mater. Sci.*, 27, 1 (1997).
[25] K. Nakada, M. Fujita, G. Dresselhaus, and M. S. Dresselhaus, *Phys. Rev. B.*, 54, 17954 (1996).
[26] Y. Takagi, K. Kusakable, and K. Nakada, *Synthetic Metals*, 121, 1337 (2001).
[27] L. M. Porter, and R. F. Davis, *Mater. Sci. & Engin.* B34, 83 (1995).
[28] S.-K. Lee, C.-M. Zetterling, E. Danielson, M. Östling, J.-P. Palmquist, H. Högberg, and U. Jansson, *Appl. Phys. Lett.*, 77, 1478 (2000).
[29] N. Lundberg, and M. Östling, *Solid-State Electronics*, 39, 1559 (1996).
[30] T. Jang, L. M. Porter, G. W. M. Rutsch, and B. Odekirk, *Appl. Phys. Let.*, 75, 3956 (1999).
[31] J. D. Parsons, G. B. Kruaval, and A. K. Chaddha, *Appl. Phys. Lett.*, 65, 2075 (1994).
[32] A. K. Chaddha, J. D. Parsons, and G. B. Kruaval, *Appl. Phys. Lett.*, 66, 760 (1995).
[33] S.-K. Lee, C.-M. Zetterling, M. Östling, J.-P. Palmquist, H. Högberg, and U. Jansson, *Solid State Electronics*, 44, 1179 (2000).
[34] T. N. Oder, J. R. Williams, S. E. Mohney, and J. Crofton, *J. Electr. Mater.*, 27, 12 (1998).
[35] R. C. Glass, L. M. Spellman, and R. F. Davis, *Appl. Phys. Lett.*, 59, 2868 (1991).
[36] B. Pécz, *Appl. Surf. Sci.*, 184, 287 (2001).
[37] J. Crofton, P. G. McMullin, J. R. Williams, and M. J. Bozack, *J. Appl. Phys.*, 77, 1317 (1995).
[38] F. Roccaforte, F. La Via, V. Raineri, L. Calcagno, and P. Musumeci, *Appl. Surf. Sci.*, 184, 295 (2001).
[39] M. G. Rastegaeva, A. N. Andreev, A. A. Petrov, A. I. Babanin, M. A. Yagovkina, and I. P. Nikitina, *Mater. Sci. and Engin.*, B46, 254 (1997).
[40] E. Kurimoto, H. Harima, T. Toda, M. Sawada, M. Iwami, and S. Nakashima, *J. Appl. Phys.*, 91, 10215 (2002).
[41] S. Y. Han, K. H. Kim, J. K. Kim, H. W. Jang, K. H. Lee, N.-K. Kim, E. D. Kim, and J.-L. Lee, *Appl. Phys. Lett.*, 79, 1816 (2001).
[42] S. Y. Han, and J.-L. Lee, *J. Electrochem. Soc.*, 149, G189 (2002).
[43] M. J. Bozack, *Phys. Stat. Sol.(b)*, 202, 549 (1997).
[44] L. Spain, *"Chemistry and Physics of Carbon"*, edited by P. L. Walker, Jr. et al., Vol. 16, Marcel Dekker, Inc., New York, p119–259 (1981).
[45] A. Oya, and H. Marsh, *J. Mater. Sci.*, 17, 309 (1982).
[46] A. Oya, and S. Otani, Carbon, 17, 131 (1979).
[47] G. Katagiri, H. Ishida, and A. Ishitani, Carbon, 26, 565 (1988).
[48] N. Wada, P. J. Gaczi, and A. Solin, *J. Non-Cryst. Solid*, 35–36, 543 (1980).
[49] M. P. Siegal, D. R. Tallant, L. J. Martinez-Miranda, J. C. Barbour, R. L. Simpson, and D. L. Overmyer, *Phys. Rev. B.* 61, 10451 (2000).
[50] M. S. Dresselhaus, and G. Dresselhaus, *Adv. Phys.* 30, 139 (1980).
[51] N. Caswell, and S. A. Solin, *Solid State Comm.*, 27, 961 (1978).
[52] K. Robbie, S. T. Jemander, N. Lin, C. Hallin, R. Erlandson, G. V. Hansson, and L. D. Madsen, *Phys. Rev. B*, 64, 155401 (2001).
[53] W. L. Holstein, R. D. Moorhead, H. Hoppa, and M. Boudart, "Chemistry and Physics of Carbon", Vol. 18, edited by P. A. Thrower, Marcel Dekker, Inc., New York, p139, 1982.
[54] K. Hernadi, A. Fonseca, J. B. Nagy, A. Siska, and I. Kiricsi, *Appl. Catal.*, 199, 245 (2000).
[55] N. M. Rodriguez, *J. Mater. Res*, 8, 3233 (1993).
[56] CRC Handbook of Chemistry and Physics, $64^{th}$ edition, CRC Press, Boca Ration, Fla., 1983, p. D-51.
[57] H. W. Kroto, J. R. Heath, S. C. O'Brien, R. F. Curl, and R. E. Smalley, Nature, 318, 162 (1985).
[58] P. Moriarty, Reports on Progress in Physics, 64, 297 (2001).
[59] I. Mochida, M. Egashira, Y. Korai, and K. Yokogawa, Carbon, 35, 1707 (1997).
[60] M. Pedio, K. Hevesi, N. Zema, M. Capozi, P. Perfetti, R. Gouttebaron, J.-J. Pireaux, R. Caudano, and P. Rudolf, *Surf. Sci.*, 437, 249 (1999).

[61] E. Czerwosz, B. Surma, and A. Wnuk, *J. Phys. Chem. of Solids*, 61, 1973 (2000).
[62] E. Czerwosz, P. Dluzewski, G. Dmowska, G. Dmowska, R. Nowakowski, E. Starnawska, and H. Wronka, *Appl. Surf. Sci.*, 141, 350 (1999).
[63] G. Willians, C. Pearson, M. R. Bryce, and M. C. Petty, *Thin Film Solids*, 209, 150 (1992).
[64] R. Beck, and R. B. Lennox, *J. Phys. Chem.*, 96, 8149 (1992).
[65] T. Imae, and Y. Ikeo, *Supermolecular Sciences*, 5, 61 (1998).
[66] V. Saltas, and C. A. Papageorgopoulos, *Surface Sciences*, 488, 23 (2001).
[67] D. S. Bethune, G. Meijer, W. C. Tang, H. J. Rosen, W. G. Golden, H. Seki, C. A. Brown, and M. S. de Vries, Chem. Phys. Lett., 179, 181 (1991).
[68] F. Turnstra and J. L. Koenig, J. Chem Physics, 53, 3, 1126 (1970).
[69] C.-M. Sung, and M.-F. Tai, *Int. J. Refractory Metals & Hard Materials*, 15, 237 (1997).

APPENDIX 2

Data Tables

TABLE 1

Specific resistivites of M/C/4H—SiC after annealing at 800° C. in vacuum for two hours

| | Ni/C/SiC | Co/C/SiC | Cr/C/SiC | NiCr/C/SiC |
|---|---|---|---|---|
| n-type, C-face, on-axis, and $3.1 \times 10^{19}$ cm$^{-3}$ | $1.84 \times 10^{-5}$ $\Omega$cm$^2$ | $1.39 \times 10^{-4}$ $\Omega$cm$^2$ | $4.79 \times 10^{-4}$ $\Omega$cm$^2$ | $3.04 \times 10^{-4}$ $\Omega$cm$^2$ |
| n-type, C-face, on-axis, and $1.6 \times 10^{18}$ cm$^{-3}$ | $1.43 \times 10^{-4}$ $\Omega$cm$^2$ | $2.04 \times 10^{-4}$ $\Omega$cm$^2$ | Not ohmic | Not ohmic |

TABLE 2

Enthalpy and free energy of various carbides [56]

| Metals | Effective solubility (atom %) at 1000° C. | Carbides | $\Delta H°$ (kcal/mol) of carbide | $\Delta G°$ (kcal/mol) of carbide |
|---|---|---|---|---|
| Al | No data | Al$_4$C$_3$ | −49.9 | −46.9 |
| Au | 0.01 | AuC | Non-existing | Non-existing |
| Co | 3.41 | Co$_2$C | −10.0 | No data |
| Cr | 0.20 | Cr$_3$C$_2$ | −19.3 | −19.5 |
| Mo | 0.50 | Mo$_2$C | −10.9 | No data |
| Ni | 2.03 | Ni$_2$C | Non-existing | Non-existing |
| Ti | 1.88 | TiC | −44.1 | −43.2 |
| W | 0.44 | WC | −9.69 | No data |

TABLE 3

Specific resistivities of Ni/C film on various n-type SiC substrates after annealing in Ar for two hours at stated temperatures

| SiC type and doping level | 600° C. | 700° C. | 800° C. | 900° C. | 1000° C. |
|---|---|---|---|---|---|
| C-face, on-axis, $3.1 \times 10^{19}$ cm$^{-3}$ | X | 1.44E-4 | 1.25E-5 | 5.86E-6 | 2.56E-6 |
| C-face, on-axis, $2.6 \times 10^{17}$ cm$^{-3}$ | X | X | X | 4.44E-4 | 4.43E-4 |
| Si-face, 8°-off, $1.8 \times 10^{19}$ cm$^{-3}$ | X | 5.39E-6 | 9.22E-7 | 5.01E-6 | 4.59E-7 |

TABLE 3-continued

Specific resistivities of Ni/C film on various n-type SiC substrates after annealing in Ar for two hours at stated temperatures

| SiC type and doping level | 600° C. | 700° C. | 800° C. | 900° C. | 1000° C. |
|---|---|---|---|---|---|
| Si-face, 8°-off, $4.4 \times 10^{18}$ cm$^{-3}$ | X | X | 6.49E-4 | 1.39E-5 | 7.29E-6 |
| Si-face, on-axis, $3.1 \times 10^{19}$ cm$^{-3}$ | X | 1.26E-6 | 6.58E-7 | 1.51E-5 | 2.30E-5 |
| Si-face, on-axis, $1.6 \times 10^{18}$ cm$^{-3}$ | X | X | 1.60E-4 | 1.15E-4 | 9.46E-5 |
| Si-face, on-axis, $1.1 \times 10^{17}$ cm$^{-3}$ | X | X | X | 7.85E-5 | 5.75E-4 |

TABLE 4 specific resistivities of Carbon/n-type SiC after annealing at stated temperatures in Ar for 30 minutes (4H—SiC, n-type, Si-face, on-axis, doping concentration of $3.1 \times 10^{19}$ cm$^{-3}$)

| | Example # | | | |
|---|---|---|---|---|
| | 46 | 47 | 48 | 49 |
| Temperatures (° C.) | 1050 | 1150 | 1250 | 1350 |
| Specific Resistivity ($\Omega$cm$^2$) | $4.31 \times 10^{-3}$ | $1.03 \times 10^{-3}$ | $8.16 \times 10^{-4}$ | $4.28 \times 10^{-4}$ |

We claim:
1. The method of fabricating a graphitic sp$^2$ Carbon-inclusive ohmic contact for an n-type Silicon Carbide semiconductor device, said method comprising the steps of:
   providing a clean surfaced wafer sample of n-type Silicon Carbide of selected doping concentration between $1 \times 10^{16}$ and $1 \times 10^{20}$ atoms per cubic centimeter;
   covering said sample clean surface with a layer of amorphous sp$^2$ and sp$^3$ Carbon mixture;
   supplying a layer of Carbon conversion-accelerating catalytic metal over said sample layer of amorphous sp$^2$ and sp$^3$ Carbon mixture;
   converting a substantial portion of said catalytic metal covered amorphous sp$^2$ and sp$^3$ Carbon mixture on said sample to metal catalyzed nano-sized graphitic flakes of sp$^2$ Carbon;
   said converting step including a heat treating annealing of said sample at a temperature of at least 700 degrees Celsius, a temperature selected in response to said selected doping concentration between $1 \times 10^{16}$ and $1 \times 10^{20}$ atoms per cubic centimeter; and
   disposing an external circuit electrically conductive element in contact with a selected portion of said converted, metal catalyzed nano-sized graphitic flakes of sp$^2$ Carbon.
2. The method of fabricating a graphitic sp$^2$ Carbon-inclusive ohmic contact for a n-type Silicon Carbide semiconductor device of claim 1 wherein said steps of covering and supplying each include a direct current sputtering sequence.
3. The method of fabricating a graphitic sp$^2$ Carbon-inclusive ohmic contact for a n-type Silicon Carbide semiconductor device of claim 1 wherein said converting step includes one of a vacuum and an argon sample-surrounding atmosphere.
4. The method of fabricating a graphitic sp$^2$ Carbon-inclusive ohmic contact for a n-type Silicon Carbide semi- conductor device of claim 1 wherein said providing step comprises supplying a Nitrogen doped wafer having one of a Carbon-faced and a Silicon-faced surface.

5. The method of fabricating a graphitic $sp^2$ Carbon-inclusive ohmic contact for a n-type Silicon Carbide semiconductor device of claim 4 wherein said providing step comprises supplying a wafer having one of an on-axis, an eight degree off-axis and a three and one half degree off-axis wafer surface.

6. The method of fabricating a graphitic $sp^2$ Carbon-inclusive ohmic contact for a n-type Silicon Carbide semiconductor device of claim 4 wherein said catalyzing metal of said converting step is one of metals Nickel and Cobalt.

7. The method of fabricating a graphitic $sp^2$ Carbon-inclusive ohmic contact for a n-type Silicon Carbide semiconductor device of claim 4 wherein:
said catalyzing metal of said converting step is nickel;
said converting step includes a Silicon Carbide doping concentration between $1 \times 10^{17}$ and $1 \times 10^{19}$ atoms per cubic centimeter;
said converting step including a heat treating annealing of said sample at a temperature of 700 degrees Celsius; and
said ohmic contact achieves a specific contact resistivity of $10_{-6}$ to $10^{-7}$ ohm-centimeter.

8. The method of fabricating a graphitic $sp^2$ Carbon-inclusive ohmic contact for a n-type Silicon Carbide semiconductor device of claim 1 wherein:
said step of supplying a layer of Carbon conversion-accelerating catalytic metal over said sample layer of amorphous $sp^2$ and $sp^3$ Carbon mixture comprises supplying a layer of one of the metals Nickel, Cobalt, Chromium, and Nickel-Chromium alloy; and
said converting step including a heat treating annealing of said sample at a temperature of at least 800 degrees Celsius.

9. The method of fabricating a graphitic $sp^2$ Carbon-inclusive ohmic contact for a n-type Silicon Carbide semiconductor device of claim 8 wherein:
said step of providing a clean surfaced wafer sample of Silicon Carbide of selected doping concentration between $1 \times 10^{16}$ and $1 \times 10^{20}$ atoms per cubic centimeter comprises supplying an n-channel Nitrogen-doped wafer of $3.1 \times 10^{19}$ atoms per cubic centimeter doping level;
said wafer has a Carbon-faced on-axis surface;
said converting step includes a heat treating annealing of said sample in an Argon atmosphere at a temperature of at least 800 degrees Celsius; and
said ohmic contact achieves a specific contact resistivity of between $1 \times 10^{-4}$ and $5 \times 10^{-4}$ ohm-centimeter.

10. The method of fabricating a graphitic $sp^2$ Carbon-inclusive ohmic contact for a n-type Silicon Carbide semiconductor device of claim 1 wherein:
said step of supplying a layer of Carbon conversion-accelerating catalytic metal over said sample layer of amorphous $sp^2$ and $sp^3$ Carbon mixture comprises supplying a layer of one of the metals Nickel and Cobalt;
said converting step including a heat treating annealing of said sample at a temperature of at least 800 degrees Celsius;
said step of providing a clean surfaced wafer sample of Silicon Carbide of selected doping concentration between $1 \times 10^{16}$ and $1 \times 10^{20}$ atoms per cubic centimeter comprises supplying an n-channel Nitrogen-doped wafer of $1.6 \times 10^{18}$ atoms per cubic centimeter doping level;
said wafer has a Silicon-faced on-axis surface;
said converting step includes a heat treating annealing of said sample in a vacuum atmosphere at a temperature of at least 800 degrees Celsius; and
said ohmic contact achieves a specific contact resistivity of between $1 \times 10^{-4}$ and $2 \times 10^{-4}$ ohm-centimeter.

11. The method of fabricating a graphitic $sp^2$ Carbon-inclusive ohmic contact for a n-type Silicon Carbide semiconductor device of claim 1 wherein said step of converting a substantial portion of said catalytic metal covered amorphous $sp^2$ and $sp^3$ Carbon mixture on said sample to metal catalyzed nano-sized graphitic flakes of $sp^2$ Carbon includes forming a thermally unstable carbide compound inclusive of said metal and said catalytic Carbon.

12. n-type Silicon Carbide nano-sized graphitic flake ohmic contact apparatus comprising the combination of:
a wafer sample of n-type Silicon Carbide of selected doping concentration between $1 \times 10^{16}$ and $1 \times 10^{20}$ atoms per cubic centimeter;
a layer of metal catalyzed $sp^2$ Carbon nano-sized graphitic flakes overlaying said wafer sample of n-type Silicon Carbide in selected contact areas thereof;
said layer of metal catalyzed $sp^2$ Carbon nano-sized graphitic flakes in said selected contact areas including a post annealing remainder sub-layer of inter-diffused Carbon and metal molecules; and
an external signal-communicating electrical conductor connected with one of said layer of metal catalyzed $sp^2$ Carbon nano-sized graphitic flakes and said post annealing remainder sub-layer of inter-diffused Carbon and metal molecules on said wafer sample of n-type Silicon Carbide.

13. The n-type Silicon Carbide nano-sized graphitic flake ohmic contact apparatus of claim 12 wherein said metal is one of the metals Nickel and Cobalt.

14. The n-type Silicon Carbide nano-sized graphitic flake ohmic contact apparatus of claim 12 wherein said wafer sample includes one of an on-axis, an eight degree off-axis and a three and one half degree off-axis wafer surface.

15. The n-type Silicon Carbide nano-sized graphitic flake ohmic contact apparatus of claim 12 wherein said wafer sample is comprised of 4H Silicon Carbide.

16. The n-type Silicon Carbide nano-sized graphitic flake ohmic contact apparatus of claim 12 wherein said wafer sample is comprised of 6H Silicon Carbide.

17. The n-type Silicon Carbide nano-sized graphitic flake ohmic contact apparatus of claim 12 wherein said nano-sized graphitic flakes in said layer of metal catalyzed $sp^2$ Carbon nano-sized graphitic flakes are of less than five nanometers nominal size.

18. The method of fabricating a graphitic $sp^2$ Carbon-inclusive ohmic contact for an n-type Silicon Carbide semiconductor device, said method comprising the steps of:
providing a clean surfaced wafer sample of n-type Silicon Carbide of selected doping concentration of $2 \times 10^{18}$ atoms per cubic centimeter;
covering said sample clean surface with a sputtering-formed layer of amorphous $sp^2$ and $sp^3$ Carbon mixture;
converting a substantial portion of said amorphous $sp^2$ and $sp^3$ Carbon mixture on said sample to nano-sized graphitic flakes of $sp^2$ Carbon;

said converting step including a heat treating annealing of said sample in an Argon atmosphere at a temperature between 1050 and 1350 degrees Celsius, a temperature also responsive to said selected doping concentration of $2\times10^{18}$ atoms per cubic centimeter; and disposing an external circuit electrically conductive element in contact with a selected portion of said nano-sized graphitic flakes of $sp^2$ Carbon.

19. The method of fabricating a graphitic $sp^2$ Carbon-inclusive ohmic contact for a n-type Silicon Carbide semiconductor device, said method comprising the steps of:

providing a clean surfaced wafer sample of n-type Silicon Carbide of selected doping concentration between $1\times10^{19}$ and $2\times10^{19}$ atoms of Nitrogen per cubic centimeter;

covering said sample clean surface with a layer of C60 Fullerene Carbon;

supplying a layer of Carbon conversion-accelerating catalytic metal over said sample layer of C60 Fullerene Carbon;

said catalytic metal being one of metals nickel and cobalt;

converting a substantial portion of said catalytic metal covered C60 Fullerene Carbon to metal-catalyzed nano-sized graphitic flakes of $sp^2$ Carbon;

said converting step including a heat treating annealing of said sample at a temperature of at least 800 degrees Celsius in one of a vacuum and an argon atmosphere; and disposing an external circuit electrically conductive element in contact with a selected portion of said converted, metal catalyzed nano-sized graphitic flakes of $sp^2$ Carbon.

20. The method of fabricating a graphitic $sp^2$ Carbon-inclusive ohmic contact for a n-type Silicon Carbide semiconductor device of claim 19 wherein:

said converting step including a heat treating annealing of said sample at a temperature of at least 800 degrees Celsius;

said wafer has an 8 degree off-axis surface; and said ohmic contact achieves a specific contact resistivity of between $1\times10^{-6}$ and $2\times10^{-5}$ ohm-centimeter.

* * * * *